United States Patent
Ueno

(10) Patent No.: US 9,478,645 B2
(45) Date of Patent: Oct. 25, 2016

(54) BIDIRECTIONAL DEVICE, BIDIRECTIONAL DEVICE CIRCUIT AND POWER CONVERSION APPARATUS

(71) Applicant: FUJI ELECTRIC CO., LTD., Kanagawa (JP)

(72) Inventor: Katsunori Ueno, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 216 days.

(21) Appl. No.: 14/187,343

(22) Filed: Feb. 24, 2014

(65) Prior Publication Data

US 2014/0169045 A1 Jun. 19, 2014

Related U.S. Application Data

(63) Continuation of application No. PCT/JP2012/005441, filed on Aug. 29, 2012.

(30) Foreign Application Priority Data

Aug. 29, 2011 (JP) .................. 2011-185762

(51) Int. Cl.
*H01L 29/739* (2006.01)
*H02M 5/458* (2006.01)
(Continued)

(52) U.S. Cl.
CPC ....... *H01L 29/7393* (2013.01); *H01L 21/0465* (2013.01); *H01L 29/66068* (2013.01); (Continued)

(58) Field of Classification Search
CPC ........... H01L 29/7393; H01L 21/0465; H01L 29/7802; H01L 29/7813; H01L 29/66712; H01L 29/7832; H01L 29/7806; H01L 29/7803; H01L 29/47; H01L 29/1066; H01L 29/0634; H01L 29/475; H01L 29/0878; H01L 29/1608

See application file for complete search history.

(56) References Cited

U.S. PATENT DOCUMENTS 5,693,569 A * 12/1997 Ueno ................ H01L 29/41766
257/472
7,411,266 B2 * 8/2008 Tu ....................... H01L 29/0634
257/492

FOREIGN PATENT DOCUMENTS

| JP | H03-194971 A | 8/1991 |
| JP | H03-289141 A | 12/1991 |

(Continued)

OTHER PUBLICATIONS

International Preliminary Report on Patentability of International Application No. PCT/JP2012/005441, issued by the International Bureau of WIPO on Mar. 13, 2014.

(Continued)

*Primary Examiner* — David Vu

(57) ABSTRACT

Provided is a longitudinal bidirectional device in which current flows in a layering direction of a semiconductor layered portion formed on a front surface of a substrate, the bidirectional device comprising a first semiconductor element that includes a first channel and is formed on the semiconductor layered portion; and a second semiconductor element that includes a second channel and is provided on the substrate side of the first semiconductor element within the semiconductor layered portion. The first semiconductor element further includes a first control electrode that controls the first channel and that is formed on a surface of the semiconductor layered portion that faces away from the substrate, and the second semiconductor element is formed on at least a portion of the surface of the semiconductor layered portion on which the first control electrode is formed and includes a second control electrode that controls the second channel.

20 Claims, 30 Drawing Sheets

(51) Int. Cl.
*H01L 29/66* (2006.01)
*H01L 29/78* (2006.01)
*H01L 21/04* (2006.01)
*H01L 29/16* (2006.01)
*H01L 29/20* (2006.01)
*H01L 29/47* (2006.01)
*H01L 29/06* (2006.01)
*H01L 29/08* (2006.01)
*H01L 29/10* (2006.01)

(52) U.S. Cl.
CPC ..... *H01L29/66712* (2013.01); *H01L 29/7802* (2013.01); *H01L 29/7803* (2013.01); *H01L 29/7806* (2013.01); *H01L 29/7813* (2013.01); *H01L 29/7832* (2013.01); *H02M 5/458* (2013.01); *H01L 29/0634* (2013.01); *H01L 29/0653* (2013.01); *H01L 29/0878* (2013.01); *H01L 29/1066* (2013.01); *H01L 29/1608* (2013.01); *H01L 29/2003* (2013.01); *H01L 29/47* (2013.01); *H01L 29/475* (2013.01)

(56) References Cited

FOREIGN PATENT DOCUMENTS

| JP | H03-289176 A | 12/1991 |
|----|--------------|---------|
| JP | H06-090009 A | 3/1994 |
| JP | 2002-299349 A | 10/2002 |
| JP | 2002-319676 A | 10/2002 |
| JP | 2003-158265 A | 5/2003 |
| JP | 2003-249654 A | 9/2003 |
| JP | 2006-086548 A | 3/2006 |
| JP | 2006-339508 A | 12/2006 |
| JP | 2008-47772 A | 2/2008 |
| JP | 2008-124511 A | 5/2008 |
| JP | 2010-10583 A | 1/2010 |

OTHER PUBLICATIONS

Office Action issued for counterpart Japanese Application 2013-531097, issued by the Japan Patent Office on Dec. 8, 2015.
H. Takahashi, et al., "1200V class Reverse Blocking IGBT (RB-IGBT) for AC Matrix Converter", Proceedings of 2004 International Symposium on Power Semiconductor Devices & ICs, May 24, 2004, p. 121, Kitakyushu, Japan.
T. Naito, et al., "1200V Reverse Blocking IGBT wiwth low loss for Matrix Converter", Proceedings of 2004 International Symposium on Power Semiconductor Devices & ICs, May 24, 2004, p. 125, Kitakyushu, Japan.
International Search Report for International Application No. PCT/JP2012/005441, issued by the Japanese Patent Office on Oct. 2, 2012.
Office Action issued for counterpart Japanese Application 2013-531097, issued by the Japan Patent Office on Jun. 14, 2016.

* cited by examiner

220

220

BIDIRECTIONAL DEVICE, BIDIRECTIONAL DEVICE CIRCUIT AND POWER CONVERSION APPARATUS

The contents of the following patent applications are incorporated herein by reference:
NO. 2011-185762 filed in Japan on Aug. 29, 2011, and
NO. PCT/JP2012/005441 filed on Aug. 29, 2012.

BACKGROUND

1. Technical Field

The present invention relates to a bidirectional device, a bidirectional device circuit, and a power conversion apparatus.

2. Related Art

A conventional power conversion apparatus is known, such as a matrix converter that performs a power conversion on AC power input thereto, and outputs the resulting power. This power conversion apparatus uses a bidirectional switch capable of causing current to flow in two directions. It is known that a power device, such as a reverse-blocking IGBT that has a breakdown voltage in the reverse direction, can be used as the bidirectional switch (for example, see Non-Patent Documents 1 and 2 and Patent Document 1). Furthermore, a thyristor with an insulating gate is known that forms a bidirectional switch by forming a transistor on both surface sides of the substrate (for example, see Patent Document 2).

Non-Patent Document 1: H. Takahashi, et al., "1200V class Reverse Blocking IGBT (RB-IGBT) for AC Matrix Converter", Proceedings of 2004 International Symposium on Power Semiconductor Devices & ICs, Kitakyushu, p. 121

Non-Patent Document 2: T. Naito, et al., "1200V Reverse Blocking IGBT with low loss for Matrix Converter", Proceedings of 2004 International Symposium on Power Semiconductor Devices & ICs, Kitakyushu, p. 125

Patent Document 1: Japanese Patent Application Publication No. 2002-319676

Patent Document 2: Japanese Patent Application Publication No. H3-194971

The bidirectional switch can be formed by connecting two transistors in parallel. However, when forming a bidirectional switch with a normal IGBT, the IGBT has low breakdown voltage in the reverse direction, and therefore each IGBT must be provided with a diode to guarantee the breakdown voltage in the reverse direction. In contrast, with a reverse-stopping IGBT, the transistor itself has a high breakdown voltage in the reverse direction, and therefore the bidirectional switch can be formed by two transistors.

However, even when using a reverse-stopping IGBT, it is necessary to use two transistors in order to form the bidirectional switch. Therefore, the size of the module is increased. It is possible to reduce the module size by forming the transistors on both surfaces of the substrate, but forming elements on both sides of the substrates makes mounting difficult, and so this is not a practical solution. Furthermore, in recent years, in order to provide a power device with little loss, semiconductors with a large bandgap such as SiC or GaN are being used as the semiconductors in power devices. However, a MOSFET and a JFET are usually used in a longitudinal power device. Since there is no inherent reverse breakdown voltage in such devices, a reverse-stopping power device cannot be formed, and the only means available has been to combine diodes to use as the bidirectional switch.

SUMMARY

Therefore, it is an object of an aspect of the innovations herein to provide a bidirectional device, a bidirectional device circuit, and a power conversion apparatus, which are capable of overcoming the above drawbacks accompanying the related art. The above and other objects can be achieved by combinations described in the claims. According to a first aspect of the present invention, provided is a longitudinal bidirectional device in which current flows in a layering direction of a semiconductor layered portion formed on a front surface of a substrate, the bidirectional device comprising a first semiconductor element that includes a first channel and is formed on the semiconductor layered portion; and a second semiconductor element that includes a second channel and is provided on the substrate side of the first semiconductor element within the semiconductor layered portion. The first semiconductor element further includes a first control electrode that controls the first channel and that is formed on a surface of the semiconductor layered portion that faces away from the substrate, and the second semiconductor element is formed on at least a portion of the surface of the semiconductor layered portion on which the first control electrode is formed and includes a second control electrode that controls the second channel.

According to a second aspect of the present invention, provided is a bidirectional device circuit comprising the bidirectional device according to the first aspect of the present invention, and a control circuit that controls the bidirectional device. According to a third aspect of the present invention, provided is a power conversion apparatus that converts and outputs received AC power, comprising an input-side circuit that receives the AC power; an output-side circuit that outputs the AC power; and the bidirectional device according to the first aspect of the present invention that is provided between the input-side circuit and the output-side circuit.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
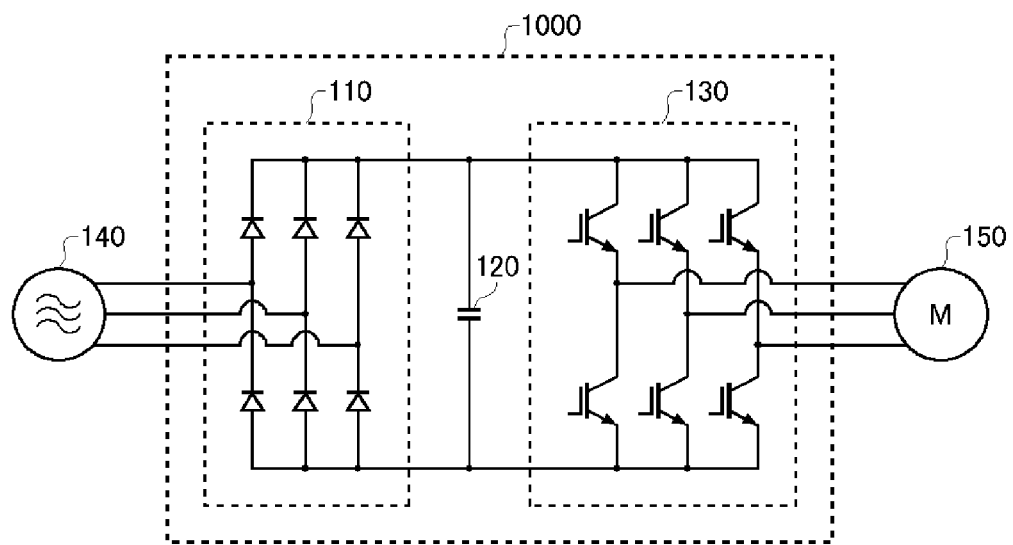
FIG. 1 is a circuit diagram of a power conversion apparatus.

FIG. 1 is a circuit diagram of a power conversion apparatus 1000 using an inverter. The power conversion apparatus 1000 includes an AC/DC converting section 110 that converts alternating current (AC) to direct current (DC), a capacitor section 120, and a DC/AC converting section 130 that converts DC to AC. The AC/DC converting section 110 converts the AC supplied from the AC power source 140 into DC. The capacitor section 120 is connected in parallel with the AC/DC converting section 110 and generates an intermediate voltage corresponding to the DC. The capacitor section 120 may be an electrolytic capacitor. The DC/AC converting section 130 is connected in parallel with the capacitor section 120 and supplies the load 150 with AC corresponding to the intermediate voltage. The inverter-type power conversion apparatus 1000 converts AC to DC at first and then converts the DC back to AC, and therefore the power conversion efficiency is low. When the capacitor section 120 breaks down, the power conversion function is lost, and therefore the lifespan of the capacitor section 120 determines the lifespan of the power conversion apparatus 1000.

Figure 2:
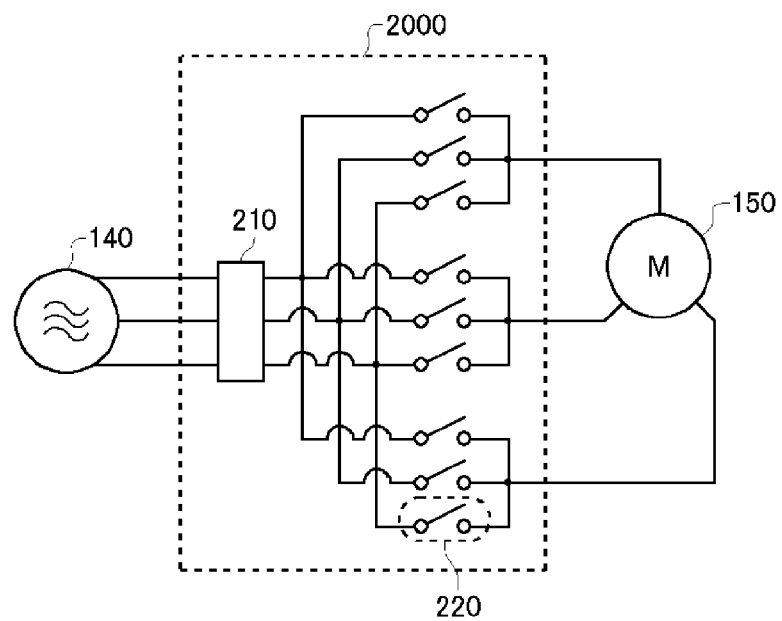
FIG. 2 is a circuit diagram of another power conversion apparatus.

FIG. 2 shows a power conversion apparatus 2000 using a matrix converter. The power conversion apparatus 2000 includes a filter section 210 and a plurality of bidirectional switches 220 for selectively connecting one of three input terminals of the load 150 to each of the output terminals of the three-phase AC power source 140. The bidirectional switch 220 is formed by a power device capable of causing bidirectional current flow. By controlling the bidirectional switch 220, the power conversion apparatus 2000 converts the AC supplied from the AC power source 140 directly into a desired AC and supplies this AC to the load 150. The matrix converter-type power conversion apparatus 2000 performs AC-AC conversion, and therefore the power conversion efficiency is higher than that of the power conversion apparatus 1000. Furthermore, the power conversion apparatus 2000 does not use a capacitor, and therefore the lifespan of the apparatus is not determined by the lifetime of the capacitor. In addition, the power conversion apparatus 2000 can perform bidirectional power transmission, enabling easy power regeneration and answering the demand for low energy consumption.

Figure 3:
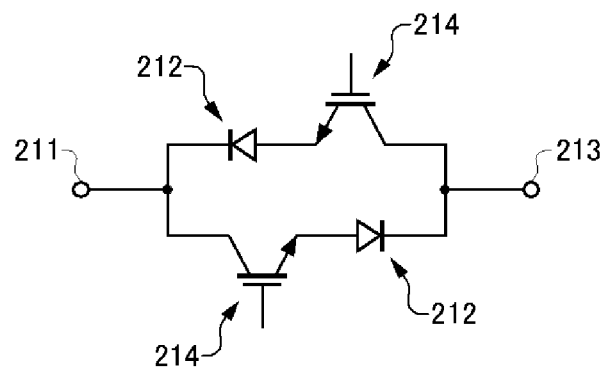
FIG. 3 is a circuit diagram of a bidirectional switch serving as a comparative example.

FIG. 3 is a circuit diagram of an exemplary bidirectional switch 220. The bidirectional switch 220 includes two sets that each include a diode 212 and a transistor 214 connected in series. The sets of a diode 212 and a transistor 214 are connected in a reverse parallel manner between the first terminal 211 and the second terminal 213. The transistor 214 in this example is an IGBT. A power device, which can be represented by the IGBT or other devices, has a low breakdown voltage in the reverse direction, and therefore the breakdown voltage in the reverse direction is maintained by the diodes 212. However, the bidirectional switch 220 has many elements that cause significant power loss and force the bidirectional switch 220 to become large overall.

Figure 4:
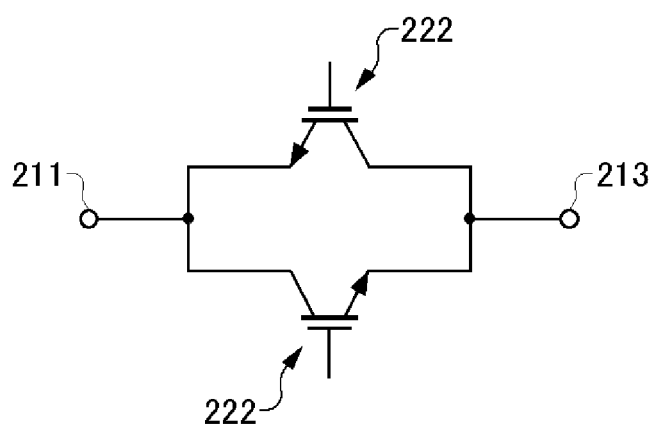
FIG. 4 is a circuit diagram of another bidirectional switch serving as a comparative example.

FIG. 4 is a circuit diagram of another exemplary bidirectional switch 220. The bidirectional switch 220 in this example includes two transistors 222 that are connected in a reverse parallel manner between the first terminal 211 and the second terminal 213. The transistor 222 in this example is a reverse-stopping IGBT with a high breakdown voltage in the reverse direction. In other words, the reverse-stopping IGBT operates as a normal IGBT when a forward voltage is applied between the collector and emitter, and maintains a breakdown voltage that is approximately equivalent to the breakdown voltage to forward voltage when a reverse voltage is applied. For example, in the case of a silicon substrate, a breakdown voltage of 600 V is realized for a thickness of 100 μm and a breakdown voltage of 1200 V is realized for a thickness of 200 μm. The bidirectional switch 220 using the reverse-stopping IGBT has lower loss and smaller overall size than the bidirectional switch 220 shown in FIG. 3 due to including fewer elements, but it is necessary to provide two transistors in parallel.

Figure 5:
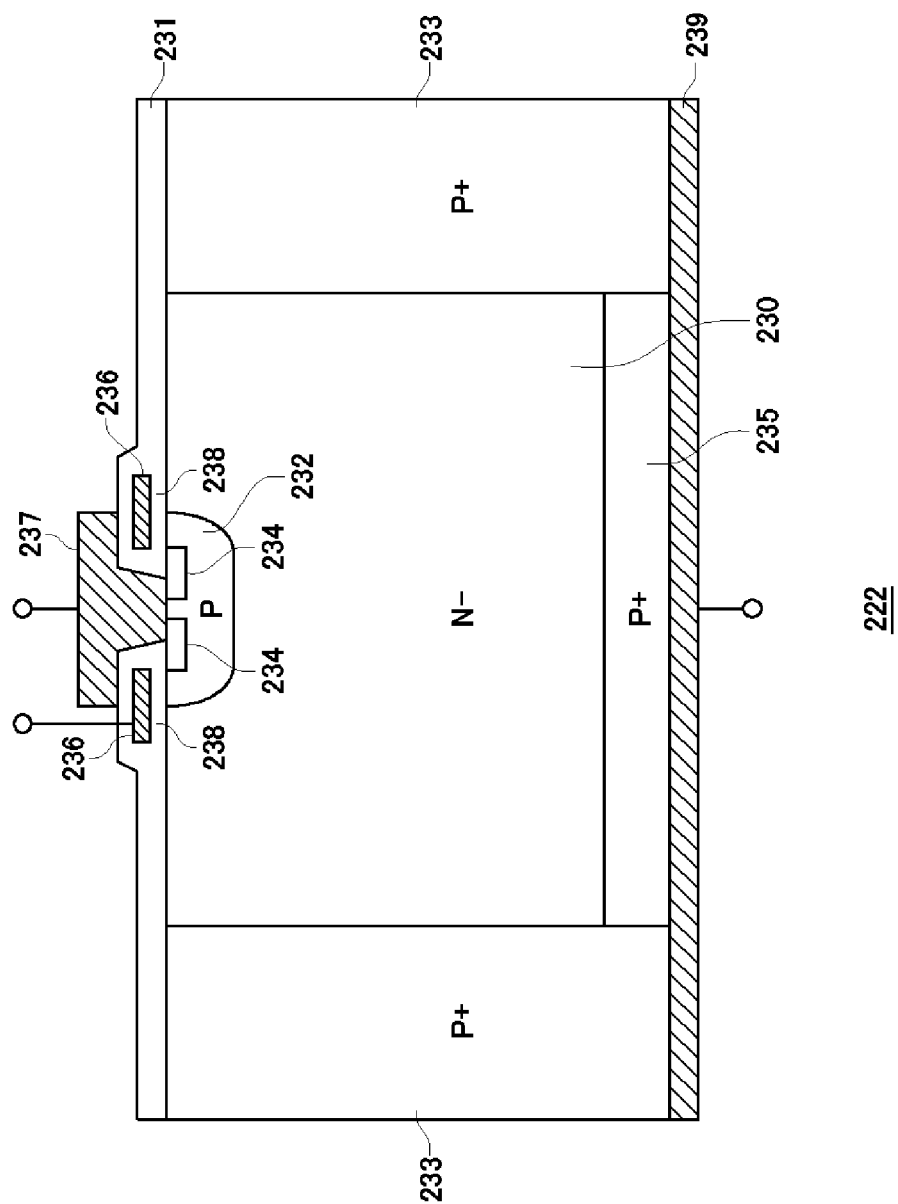
FIG. 5 is a cross-sectional view of a reverse-stopping IGBT.

FIG. 5 is a cross-sectional view of a transistor 222. The transistor 222 includes a semiconductor substrate 230, a P type base region 232 formed on the surface of the semiconductor substrate 230, an N+ type emitter region 234 formed on the surface of the P type base region 232, a P+ type collector region 235 formed on the back surface of the semiconductor substrate 230, a P+ type protective region 233 formed on the side surface of the semiconductor substrate 230, a control electrode 236 sandwiched between the N+ type emitter region 234 and the semiconductor substrate 230 and formed above the P type base region 232 with the gate insulating film 238 interposed therebetween, an emitter electrode 237 that is isolated from the control electrode 236 by the insulating film 231 and is in a conductive state with the N+ type emitter region 234 and the P type base region 232, and a collector electrode 239 that is formed on the back surface side of the semiconductor substrate 230 to be in a conductive state with the P+ type collector region 235 and the P+ type protective region 233. The semiconductor substrate 230 is an N− type substrate. The N− type semiconductor region of the semiconductor substrate 230 functions as a drift region of the IGBT.

The side surface of the semiconductor substrate 230 is covered by the P+ type protective region 233, and therefore the PN junction is not exposed on the side surface of the semiconductor substrate 230. Therefore, when a reverse bias is applied to the collector electrode 239, a depletion layer appears only on the device surface side. The device surface side has fewer defects than the device side surface created by dicing, and therefore even if a depletion layer were to occur, there would be little leak current. Therefore, sufficient reverse breakdown voltage can be realized. By creating a breakdown voltage structure such as a guard ring on the device surface side, the overall breakdown voltage can be improved.

However, a reverse-stopping IGBT such as this transistor 222 has the following problems.

1) With a reverse-stopping IGBT formed on a silicon substrate, the silicon substrate must be made thicker when the desired resistance is higher, and as a result the breakdown voltage of the silicon substrate is increased and the overall efficiency is reduced. Furthermore, when the silicon substrate is made thicker, the device size is increased, and this is not practical.

2) If the semiconductor substrate of the reverse-stopping IGBT is formed of a wide bandgap material such as silicon carbide (SiC) or gallium nitride (GaN), since the built-in voltage of the PN junction is greater than in silicon, a large forward voltage is set for the IGBT.

3) In the reverse-stopping IGBT, the free wheeling diode continues applying a positive voltage to the control electrode. Accordingly, the optimal device configuration as the IGBT and the optimal device configuration as the diode are preferably realized by a single device. However, when the forward voltage is applied during IGBT operation, a field stop layer cannot be provided to stop the depletion layer on the collector side, and the only solution is to increase the thickness of the base layer. As a result, the drift layer becomes thicker and the resistance thereof becomes higher, which causes the switching characteristic and ON voltage characteristic to be lower than in a normal device.

4) Even when a reverse-stopping IGBT is used, two power devices are needed to form the bidirectional switch.

Figure 6A:
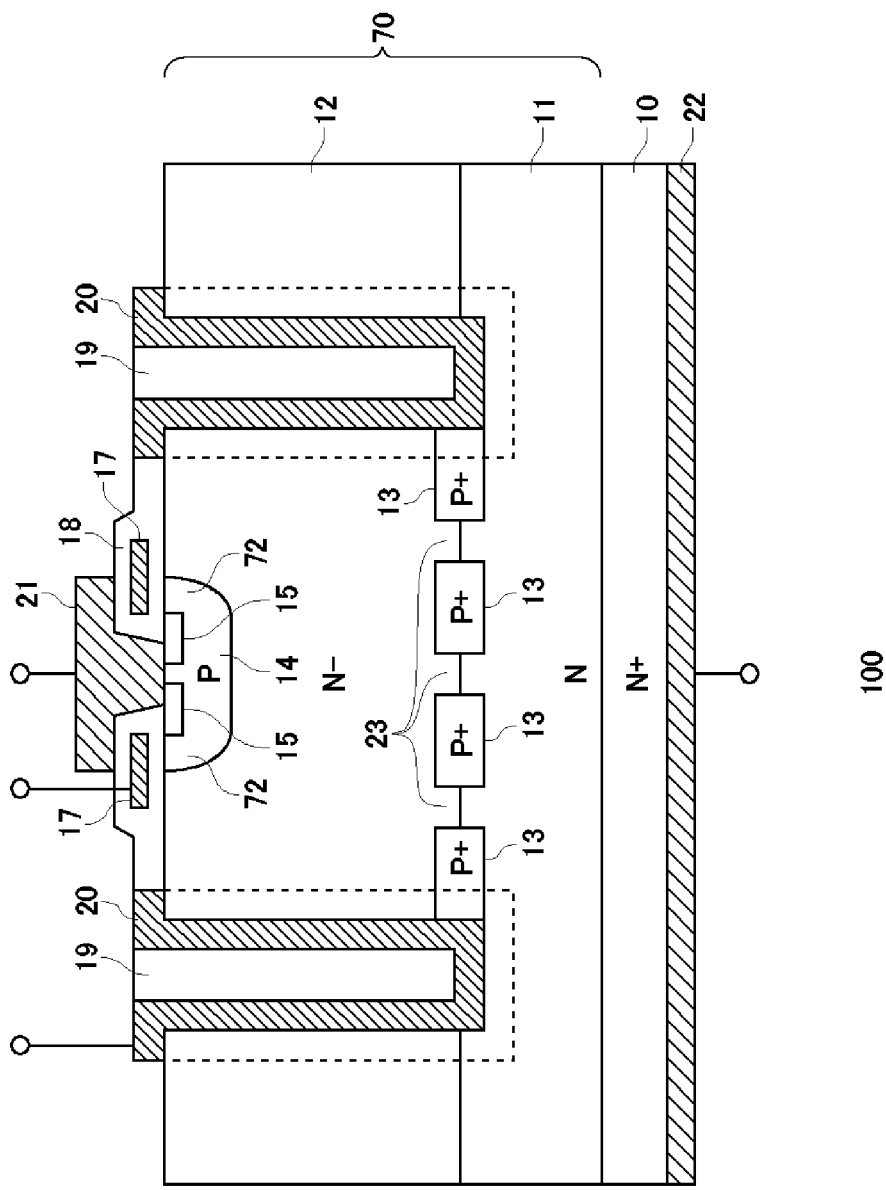
FIG. 6A is a cross-sectional view of a bidirectional device according to a first embodiment of the present invention.

FIG. 6A is a cross-sectional view of a bidirectional device 100 according to a first embodiment of the present invention. The bidirectional device 100 of the present embodiment is a longitudinal bidirectional device in which current flows in the layering direction of a semiconductor layered portion 70 formed on the surface of a substrate 10. The bidirectional device 100 includes a first semiconductor element that is formed in the semiconductor layered portion 70 and has a first channel 72, and a second semiconductor element that is provided closer to the substrate 10 than the first semiconductor element in the semiconductor layered portion 70 and has a second channel 23.

By controlling the current flowing through the first channel 72, the first semiconductor element controls the voltage flowing between the first electrode 21 and the second electrode 22. By controlling the current flowing through the second channel 23, the second semiconductor element controls the current flowing between the first electrode 21 and the second electrode 22. In the present embodiment, the first channel 72 is a channel in which the carriers move in a direction substantially parallel to the substrate 10, and the second channel 23 is a channel in which the carriers move in a direction substantially perpendicular to the substrate 10. In the present embodiment, the first semiconductor element is a MOSFET and the second semiconductor element is a JFET.

The bidirectional device 100 includes the substrate 10, the semiconductor layered portion 70, a first electrode 21, a second electrode 22, a first control electrode 17, a second control electrode 20, and an insulating film 18. The substrate 10 is an N+ type semiconductor substrate. The substrate 10 may be a SiC substrate, or may be a nitride semiconductor substrate formed of GaN or the like. The substrate 10 may be a silicon substrate. If the substrate 10 is a substrate with low resistance, another material can be used for the substrate.

The semiconductor layered portion 70 is formed on the primary surface of the substrate 10. The semiconductor layered portion 70 includes the semiconductor layers 11 and 12 having a first conduction type. In the present embodiment, the first conduction type is N type, and the semiconductor layers include an N type high concentration layer 11 and an N− type low concentration layer 12. In the semiconductor layered portion 70, the layer serving as the active layer of the device includes SiC or a nitride semiconductor material such as GaN. In this embodiment, the high concentration layer 11, the low concentration layer 12, and the regions contained in these layers are formed of SiC or a nitride semiconductor material such as GaN. The impurity concentration in the high concentration layer 11 is lower than the impurity concentration in the substrate 10 and higher than the impurity concentration in the low concentration layer 12.

The semiconductor layered portion 70 includes, in a plane that is substantially parallel to the substrate 10 within the semiconductor layers 11 and 12 of the first conduction type, a first semiconductor region 13 of a second conduction type formed such that a portion of the semiconductor layers 11 and 12 of the first conduction type remain. In the present embodiment, the second conduction type is P, and the first semiconductor region 13 is a P+ type semiconductor region. A plurality of first semiconductor regions 13 are formed separately in the semiconductor layers 11 and 12 of the first conduction type in a plane substantially perpendicular to the substrate 10. In the plane in which the first semiconductor regions 13 are formed, the semiconductor layers 11 and 12 of the first conduction type may be arranged at substantially uniform intervals.

FIG. 6A shows a plurality of first semiconductor regions 13, and the first semiconductor regions 13 are connected to each other. With this configuration, PN junctions are formed between the semiconductor layers 11 and 12 of the first conduction type and the first semiconductor regions 13, and a second channel 23 corresponding to the voltage applied to the second control electrode 20 is formed in each of the semiconductor layers 11 and 12 of the first conduction type remaining in the plane where the first semiconductor regions 13 are formed. In the present embodiment, the first semiconductor regions 13 are formed at the interface between the high concentration layer 11 and the low concentration layer 12. The first semiconductor regions 13 may be embedded in a manner to be present in both the high concentration layer 11 and the low concentration layer 12. The second channel 23 of the present embodiment is formed at the interface portion between the high concentration layer 11 and the low concentration layer 12, and is a channel in which the carriers move in a direction perpendicular to the substrate 10. The interface portion between the high concentration layer 11 and the low concentration layer 12 may refer to both the interface itself and to a region spanning into both the high concentration layer 11 and the low concentration layer 12. Instead, this interface portion may refer to both the interface itself and to a region spanning into only one of the high concentration layer 11 and the low concentration layer 12.

The semiconductor layered portion 70 includes an N+ type source region 15 and a P type diffusion region 14 formed on the surface of the low concentration layer 12. In other words, the semiconductor layered portion 70 includes the N+ type source region 15 (second semiconductor region), the P type diffusion region 14 (third semiconductor region), and the low concentration layer 12 (third semiconductor region) adjacent to each other in the stated order, in planes substantially parallel to the substrate 10 on the first control electrode 17 side of the first semiconductor region 13. A first channel 72 is formed in the P type diffusion region 14, according to the voltage applied to the first control electrode 17. In the present embodiment, the P type diffusion region 14 is formed in the central portion of the N+ type source region 15. The P type diffusion region 14 is formed to surround the N+ type source region 15.

The first electrode 21 is provided on the front surface side of the semiconductor layered portion 70, and the second electrode 22 is provided on the back surface side of the substrate 10. The first electrode 21 and the second electrode 22 function as source and drain electrodes of the bidirectional device 100. The front surface of the semiconductor layered portion 70 refers to the surface facing away from the substrate 10. The back surface of the substrate 10 refers to the surface facing away from the semiconductor layered portion 70. The first electrode 21 forms an ohmic junction with the N+ type source region 15. The second electrode 22 forms an ohmic junction with the substrate 10.

The first control electrode 17 is formed to correspond to the P type diffusion region 14 exposed on the surface of the semiconductor layered portion 70 facing away from the substrate 10. The first control electrode 17 is formed above the P type diffusion region 14 with the insulating film 18 interposed therebetween, and controls the first channel 72 according to the voltage applied thereto. For example, when voltage is applied to the first control electrode 17, the first channel 72 is formed in the surface of the P type diffusion region 14 directly below the first control electrode 17, and the main current flows through the first electrode 21. Furthermore, the insulating film 18 electrically isolates the first control electrode 17 and the first electrode 21 from each other. The first semiconductor element of the present embodiment is a MOSFET that uses the first control electrode 17 to control the current flowing between the first electrode 21 and the second semiconductor element.

At least a portion of the second control electrode 20 is formed on the surface of the semiconductor layered portion 70 that is on the same side as the first control electrode 17, and controls the second channel 23. However, the plane in which the first control electrode 17 is formed and the plane in which the portion of the second control electrode is formed need not be the same plane. In other words, the plane in which the first control electrode 17 is formed and the plane on which the portion of the second control electrode is formed may have a height difference.

The second control electrode 20 is electrically connected to the first semiconductor region 13. The second control electrode 20 of the present embodiment is formed through the semiconductor layers 11 and 12 having the first conduction type, from the front surface of the semiconductor layered portion 70 to a position contacting the first semiconductor region 13. More specifically, the second control electrode 20 contacts the first semiconductor region 13 at the side surface near the bottom end. The bottom surface of the second control electrode 20 contacts the high concentration layer 11. The second control electrode 20 forms an ohmic junction with the first semiconductor region 13, and is formed of a material forming a Schottky junction with the semiconductor layers 11 and 12 having the first conduction type. The second control electrode 20 is formed of Ti, Ni, Au, Pt, Al, Mo, or an alloy of these materials, for example. The second control electrode 20 controls the second channel 23 according to the voltage applied thereto. The second semiconductor element of the present embodiment is a JFET that uses the second control electrode 20 to control the current flowing between the second electrode 22 and the first semiconductor element.

A portion of the second control electrode 20 may be formed within the mesa 19. The mesa 19 is formed to surround the first semiconductor region 13 and the N/P/N structure of the first semiconductor element. The mesa 19 may be formed from the topmost surface of the low concentration layer 12 to a prescribed position of the high concentration layer 11. The top surface of the second control electrode 20 is exposed on the front surface side of the low concentration layer 12. In other words, the first control electrode 17 and the second control electrode 20 are both provided on the primary surface side of the substrate 10. The second control electrode 20 is not limited to a mesa-type electrode structure. In the same manner as the transistor 222 shown in FIG. 5, the bidirectional device 100 may include the P+ type protective region 233 on the side surface portion of the element to prevent the PN junction portion from being exposed on the side surface of the element.

Figure 6B:
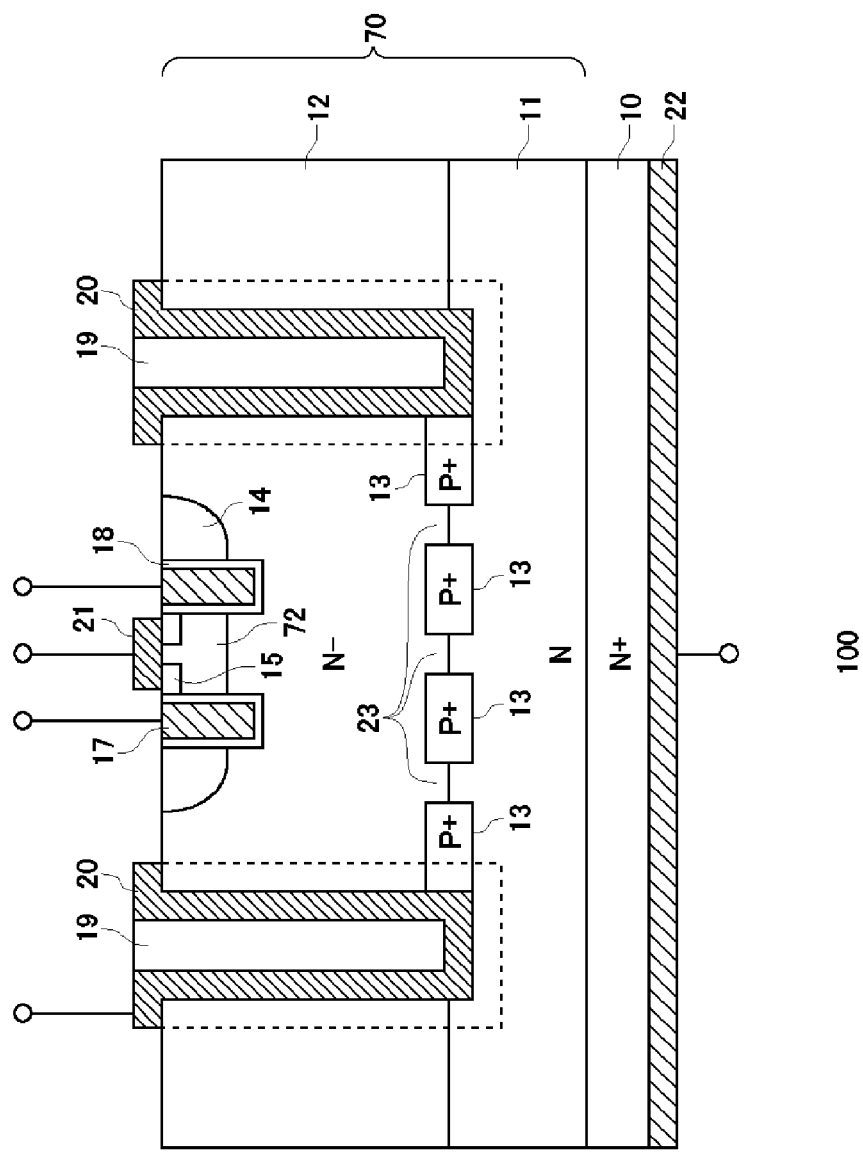
FIG. 6B is a cross-sectional view of another exemplary bidirectional device.

FIG. 6B is a cross-sectional view of a bidirectional device 100 according to another embodiment. The bidirectional device 100 of the present embodiment has a trench structure. The bidirectional device 100 of this embodiment has a different structure for the first control electrode 17, the insulating film 18, and the first electrode 21 compared to the bidirectional device 100 shown in FIG. 6A. Other structures are the same as those of the bidirectional device 100 shown in FIG. 6A.

The first control electrode 17 of the present embodiment is provided within a trench formed in the surface of the semiconductor layered portion 70. The trench is formed to surround the perimeter of the first electrode 21. The opening of the trench is formed in the P type diffusion region 14, and the trench passes through the P type diffusion region 14.

The insulating film 18 is formed on the side surface and bottom surface of the trench, and isolates the first control electrode 17 and the semiconductor layered portion 70 from each other. The first control electrode 17 is formed to fill the trench in which the insulating film 18 is formed. The N+ type source region 15, the P type diffusion region 14, and the low concentration layer 12 are in contact with each other in the direction perpendicular to the substrate 10, in the stated order, on the side surface of the trench. When voltage is applied to the first control electrode 17, the first channel 72 in the vertical direction is formed in the P type diffusion region 14 contacting the side surface of the trench.

Figure 7:
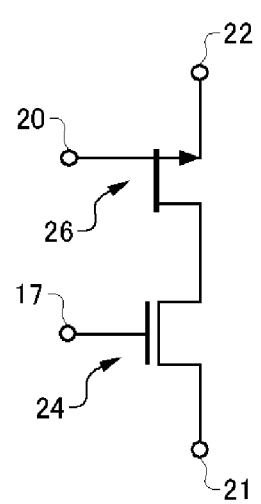
FIG. 7 is an analogous circuit of the bidirectional device shown in FIGS. 6A and 6B.

FIG. 7 shows an analogous circuit of the bidirectional device 100. The MOSFET 24, which is the first semiconductor element, and the JFET 26, which is the second semiconductor element, are connected in series between the first electrode 21 and the second electrode 22. As a result, a bidirectional switch is formed that controls the first control electrode 17 and the second control electrode 20 according to the polarity of the voltage applied to the first electrode 21 and the second electrode 22.

The following describes a specific operation of the bidirectional device 100. First, a case is described in which a negative bias is applied to the first electrode 21 and a positive bias is applied to the second electrode 22. In this case, a voltage corresponding to the ON/OFF state of the bidirectional device 100 is applied to the first control electrode 17. A desired voltage is applied to the second control electrode 20.

When a positive voltage is applied to the first control electrode 17, the first channel 72 is formed in the P type diffusion region 14 immediately below the first control electrode 17. The electrons implanted from the N+ type source region 15 proceed into the low concentration layer 12 through the first channel 72. After this, the electrons pass between the P type diffusion regions 14 to arrive at the second electrode 22, via the high concentration layer 11 and the substrate 10.

If the voltage applied to the second electrode 22 is larger than the built-in voltage of the PN diode, positive holes are implanted into the low concentration layer 12 from the first semiconductor region 13, and a bipolar current flows, resulting in an operational mode such as in an IGBT. However, usually, since a serial resistance is provided for the second control electrode 20, only a very small amount of current flows from the first semiconductor region 13 to the low concentration layer 12. Therefore, when the negative bias is applied to the first electrode 21 and the positive bias is applied to the second electrode 22, the operational mode of the bidirectional device 100 is primarily MOSFET operation due to the first semiconductor element.

Next, a case is described in which a positive bias is applied to the first electrode 21 and a negative bias is applied to the second electrode 22. In this case, a voltage corresponding to the ON/OFF state of the bidirectional device 100 is applied to the second control electrode 20. In the present embodiment, a forward bias is applied to the junction of the P type diffusion region 14 and the low concentration layer 12. Accordingly, regardless of whether the first control electrode 17 is ON or OFF, the PN diode current flows between the first electrode 21 and the second electrode 22.

When the bidirectional device 100 is OFF, the negative bias is applied to the second electrode 22 by the second control electrode 20. As a result, the depletion layer widens in the high concentration layer 11 and the second channel 23 pinches off the current. Therefore, the current is cut off between the first electrode 21 and the second electrode 22. The pattern dimensions and intervals of the first semiconductor regions 13 and the impurity concentration of the high concentration layer 11 are preferably set such that the pinch-off voltage is from 5 V to 20 V.

When the second control electrode 20 is ON, the second channel 23 is formed and electrons are supplied through the second channel 23 from the substrate 10 side. Furthermore, a forward bias current flows through the junction between the P type diffusion region 14 and the low concentration layer 12. As a result, current flows between the first electrode 21 and the second electrode 22.

When a positive bias is applied to the first electrode 21 and a negative bias is applied to the second electrode 22, the ON/OFF state of the first control electrode 17 is preferably controlled in synchronization with that of the second control electrode 20. When the second control electrode 20 is ON, the drain current is made to flow through the first channel 72 by also turning ON the first control electrode 17. Here, the electrons supplied from the substrate 10 side pass through the second channel 23 provided between the first semiconductor regions 13, without passing through the first semiconductor regions 13. In other words, since the electrons do not enter the first semiconductor regions 13, the implantation of positive holes from the first semiconductor regions 13 is restricted. As a result, high-speed switching is possible. When a reverse bias is applied to the first semiconductor regions 13 and the Schottky junction of the second control electrode 20, the depletion layer widens toward the outside of the mesa 19 from the Schottky junction portion of the side surface of the mesa 19, as shown by the dotted line in the drawings. The depletion layer is exposed only on the device surface side, and therefore the breakdown voltage can be increased by creating a structure such as a guard ring or field plate at this portion.

With the present embodiment, when a positive or negative bias is applied to the first electrode 21 and the second electrode 22, a high bidirectional breakdown voltage is maintained, and a bidirectional device capable of bidirectional switching is realized by a single longitudinal power device.

Figure 8:
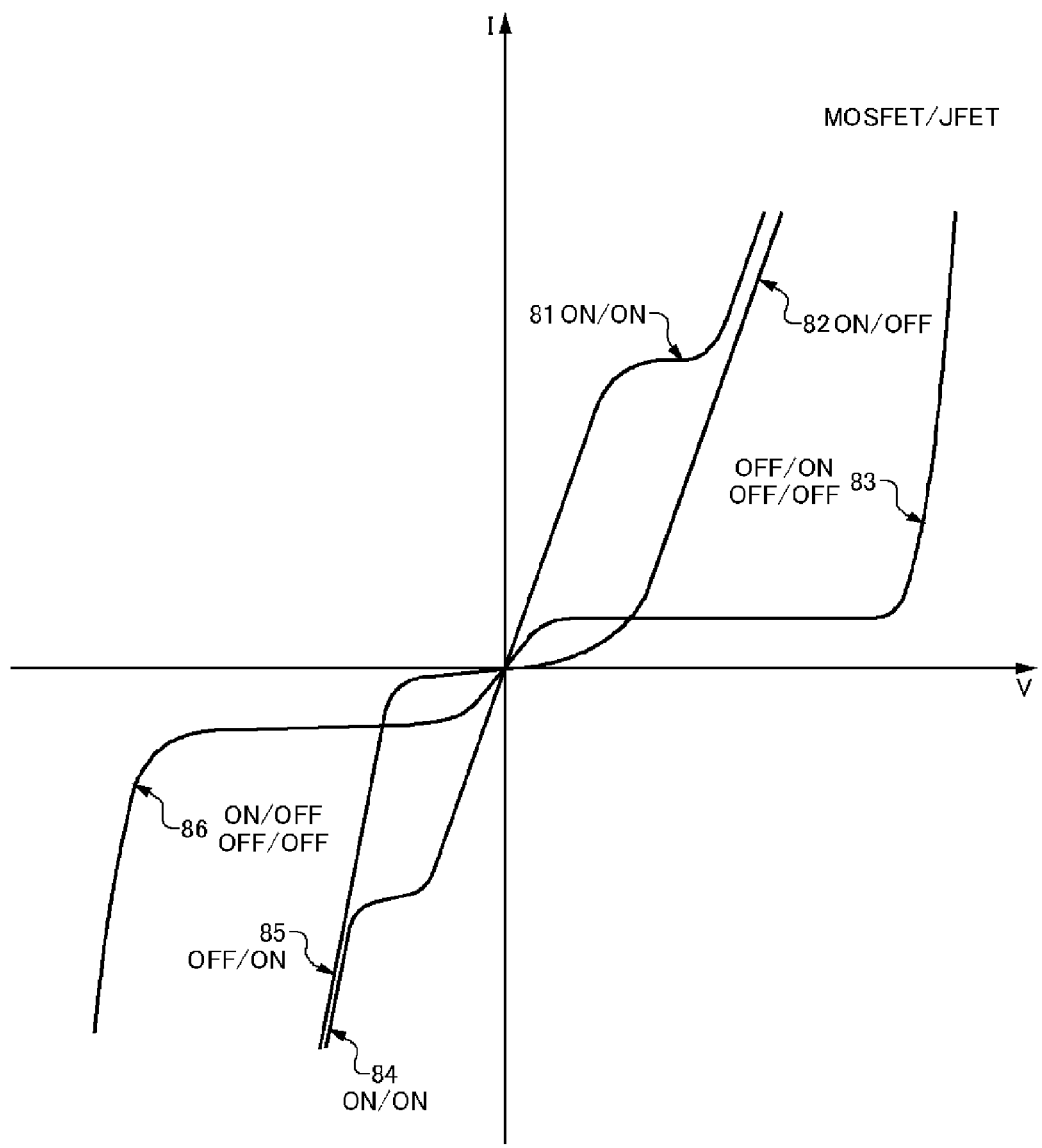
FIG. 8 is a graph showing the current-voltage characteristics of the bidirectional device shown in FIGS. 6A and 6B.

FIG. 8 is a graph showing the current-voltage characteristics of the bidirectional device 100. The horizontal axis indicates the voltage V applied to the second electrode 22. In the region where V is positive, a negative bias is applied to the first electrode 21 and a positive bias is applied to the second electrode 22. In the region where V is negative, a positive bias is applied to the first electrode 21 and a negative bias is applied to the second electrode 22. The vertical axis indicates the current I flowing through the bidirectional device 100. In the region where I is positive, the current flows from the second electrode 22 to the first electrode 21. In the region where I is negative, the current flows from the first electrode 21 to the second electrode 22. Furthermore, the I-V characteristics are represented for each ON/OFF state of the first control electrode 17 and second control electrode 20.

In the region where V is positive, when the first control electrode 17 is OFF, the bidirectional device 100 exhibits the I-V characteristic 83 in which the current does not flow until the breakdown voltage of the first semiconductor element is reached. When the first control electrode 17 is ON, the bidirectional device 100 exhibits characteristics corresponding to the state of the second control electrode 20. When the first control electrode 17 is ON and the second control electrode 20 is ON, the bidirectional device 100 exhibits the I-V characteristic 81 of the JFET. When the first control electrode 17 is ON and the second control electrode 20 is OFF, the bidirectional device 100 exhibits the I-V characteristic 82 of the diode. It should be noted that, even when the second control electrode 20 is ON, the current in the diode characteristic is such that the I-V characteristic 82 is the same as the I-V characteristic 81 when the voltage V is greater than the current of the JFET characteristic. Furthermore, when the first control electrode 17 is OFF, the bidirectional device 100 exhibits the I-V characteristic 83 in which the current does not flow until V is greater than or equal to the breakdown voltage.

In the region where V is negative, when the second control electrode 20 is OFF, the bidirectional device 100 exhibits the I-V characteristic 86 in which the current does not flow until reaching the breakdown voltage of the second semiconductor element. Furthermore, when the second control electrode 20 is ON, the bidirectional device 100 exhibits characteristics corresponding to the state of the first control electrode 17. When the first control electrode 17 is ON, the bidirectional device 100 exhibits the I-V characteristic 84 of the JFET. When the first control electrode 17 is OFF, the bidirectional device 100 exhibits the I-V characteristics 85 of the diode. It should be noted that, even when the first control electrode 17 is ON, the current in the diode characteristic is such that the I-V characteristic 85 is the same as the I-V characteristic 84 when the voltage V is greater than the current of the JFET characteristic.

As shown in FIG. 8, the control of the first control electrode 17 and the second control electrode 20 is preferably asymmetrical according to the polarity of the voltage applied to the first electrode 21 and the second electrode 22. For example, when a negative bias is applied to the first electrode 21 and a positive bias is applied to the second electrode 22, the ON/OFF state of the second control electrode 20 is not synchronized with the ON/OFF state of the first control electrode 17, and when a positive bias is applied to the first electrode 21 and a negative bias is applied to the second electrode 22, the ON/OFF state of the first control electrode 17 may be synchronized with the ON/OFF state of the second control electrode 20. Furthermore, the voltage for turning the first control electrode 17 ON/OFF may be different from the voltage for turning the second control electrode 20 ON/OFF.

Since the first semiconductor element is a normally-OFF element, the voltage applied to the first control electrode 17 is a normally-OFF control voltage. Furthermore, since the second semiconductor element is a normally-ON element, the voltage applied to the second control electrode 20 is a normally-ON control voltage.

In the bidirectional device 100, the main current is realized by a multitude of carriers and a small number of positive holes are implanted into the low concentration layer 12, and therefore the transmission conductivity modulation of the low concentration layer 12 is weak. Accordingly, when the substrate 10 is formed of silicon, the resistance is significantly larger than that of an IGBT. On the other hand, the bidirectional device 100 maintains the bidirectional breakdown voltage using the low concentration layer 12. Therefore, the low concentration layer 12 must have a prescribed thickness, and the resistance increases along with the thickness. Therefore, each semiconductor layer is preferably formed by a compound semiconductor material with low resistance, such as SiC or GaN. SiC or GaN have a smaller lattice constant and a larger bandgap than silicon. Therefore, at a high breakdown voltage, the characteristic change due to temperature is small. By forming each semiconductor layer of SiC or GaN, the resistance of the low concentration layer 12 can be significantly decreased. As a result, the thickness of the low concentration layer 12 can be decreased to approximately 10% of the thickness needed for a silicon substrate.

When the substrate 10 is formed of SiC or GaN, the thickness of the low concentration layer 12 formed of GaN, for example, is approximately 10 μm for a breakdown voltage of 1000 V and approximately 100 μm for a breakdown voltage of 10,000 V. By making the low concentration layer 12 thinner, the formation of the mesa 19 becomes easier.

Next, the method for manufacturing the bidirectional device 100 is described. FIGS. 9 to 14 show steps in the process for manufacturing the bidirectional device 100. The bidirectional device 100 manufacturing method includes a step of preparing the substrate 10, an ion implantation step of implanting P type impurities into the high concentration layer 11, an annealing step of forming the first semiconductor region 13 by thermally processing the substrate 10, a device formation step of forming a MOSFET device on the surface of the low concentration layer 12, a mesa formation step of forming the mesa 19 to surround the device, and an electrode formation step of forming a Schottky electrode within the mesa 19.

Figure 9:
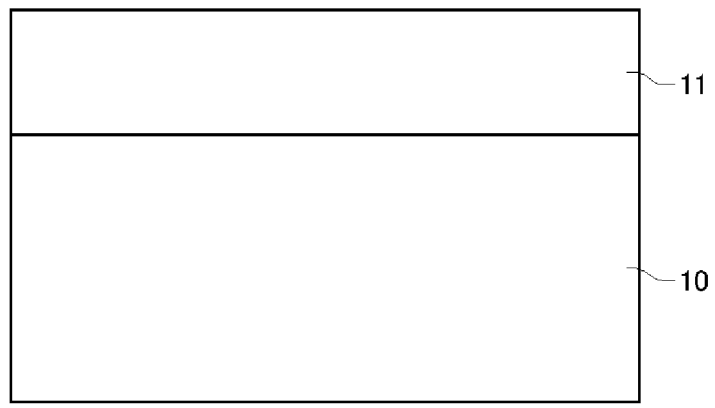
FIG. 9 shows a step in the manufacturing method of the bidirectional device shown in FIG. 6A.

FIG. 9 shows the step of preparing the substrate 10. The substrate 10 may be formed of SiC, GaN, or silicon doped with a high concentration of N type impurities. The high concentration layer 11 is epitaxially grown on the substrate 10. The high concentration layer 11 is formed of a compound semiconductor material such as SiC or GaN. If the substrate 10 is silicon, the high concentration layer 11 may be 3C—SiC. The epitaxial growth may be performed using MOCVD or the like.

Figure 10:
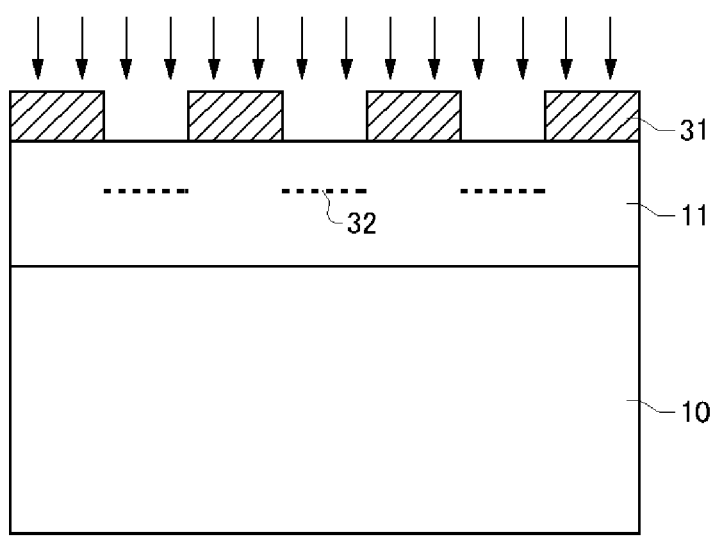
FIG. 10 shows a step following the step shown in FIG. 9.

FIG. 10 shows the ion implantation step. A mask 31 is formed on the high concentration layer 11 using photolithography techniques, and the P type impurity ions 32 are implanted with a high concentration near the surface of the high concentration layer 11. The concentration of the P type impurities may be from $1E17$ $cm^{-3}$ to $1E18$ $cm^{-3}$ for a 1000 V specification or from $1E16$ $cm^{-3}$ to $1E17$ $cm^{-3}$ for a 10,000 V specification.

Figure 11:
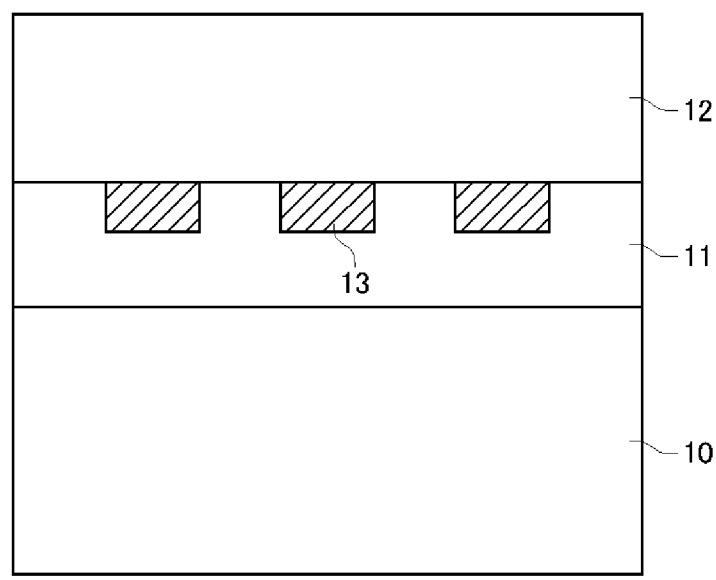
FIG. 11 shows a step following the step shown in FIG. 10.

FIG. 11 shows the annealing step. By thermally processing the substrate 10 to activate and scatter the impurity ions, the first semiconductor regions 13 are formed near the surface of the high concentration layer 11. Next, the N– type low concentration layer 12 is epitaxially grown on the high concentration layer 11 on which the first semiconductor regions 13 are formed. The N type impurity concentration of the low concentration layer 12 may be approximately $1E16$ $cm^3$ for a 1000 V specification or approximately $1E15$ $cm^{-3}$ for a 10,000 V specification.

Figure 12:
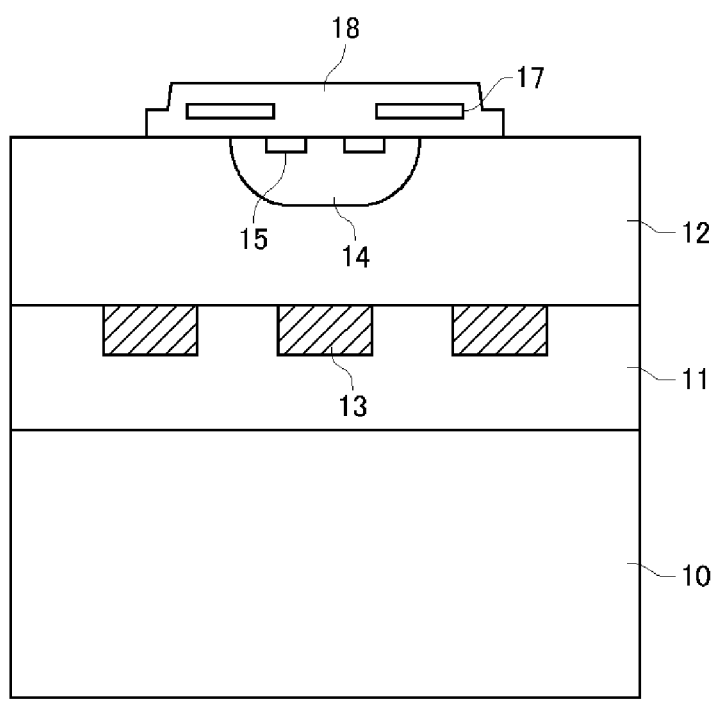
FIG. 12 shows a step following the step shown in FIG. 11.

FIG. 12 shows the device formation step. First, the P type diffusion region 14 is formed with a P type well structure by ion implanting the P type impurities implanted near the surface of the low concentration layer 12. Next, the N+ type source region 15 is formed by implanting N type impurity ions with a high concentration near the surface of the P type diffusion region 14. Next, a gate oxide film is deposited on the surface of the low concentration layer 12 including the P type diffusion region 14, using CVD. Next, the first control electrode 17 is formed above the P type diffusion region 14 sandwiched between the N+ type source region 15 and the low concentration layer 12, with the gate oxide film interposed therebetween. Finally, the insulating film is deposited over the entire surface of the device. The gate oxide film and the insulating film are referred to together as the "insulating film 18."

Figure 13:
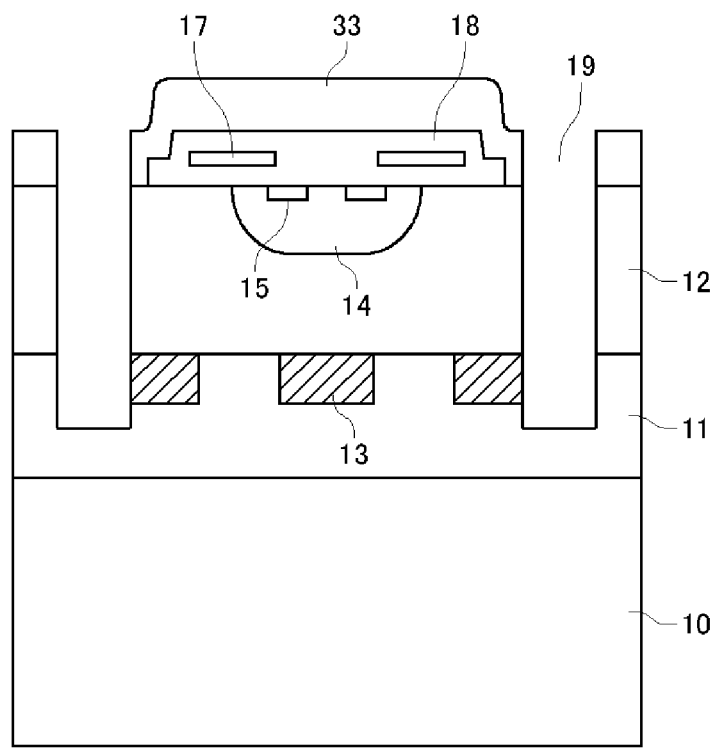
FIG. 13 shows a step following the step shown in FIG. 12.

FIG. 13 shows the mesa formation step. A mask 33 having an opening, in the region where the mesa is to be formed to surround the device, is formed on the surface of the device and the surface of the low concentration layer 12 using photolithography techniques. Next, dry etching is used to form the mesa 19 reaching from the surface of the low concentration layer 12 to the high concentration layer 11. The device formation step may be performed after the mesa formation step.

Figure 14:
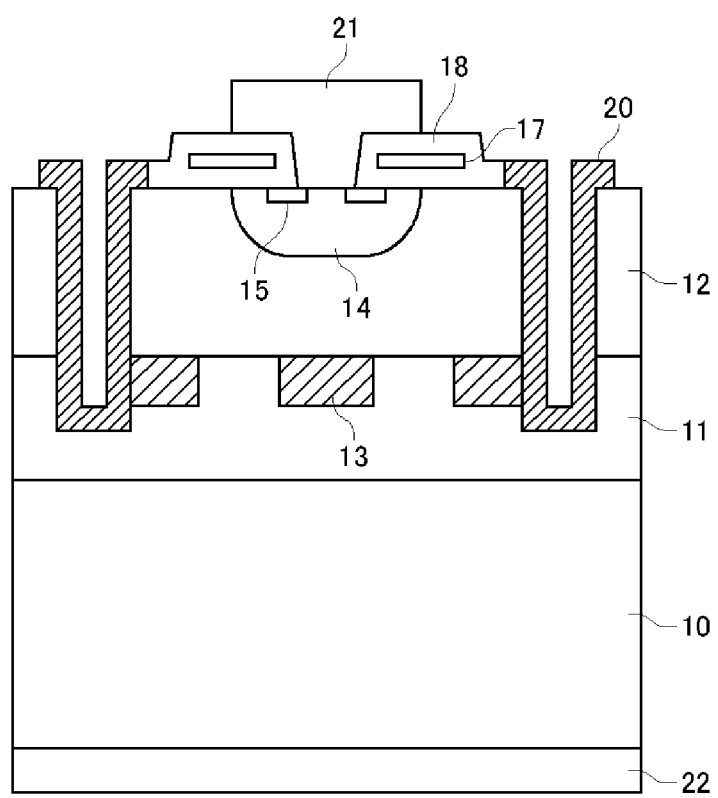
FIG. 14 shows a step following the step shown in FIG. 13.

FIG. 14 shows the electrode formation step. The second control electrode 20 is formed by depositing Ti, Ni, Au, Pt, Al, Mo or an alloy of these materials within the mesa 19, using sputtering. The second control electrode 20 may be a Schottky electrode. Next, the gate oxide layer and the insulating film are selectively removed, thereby forming the first electrode 21 that forms an ohmic junction with the P type diffusion region 14 and the N+ type source region 15 and is isolated from the first control electrode 17. Next, the second electrode 22 is formed on the back surface of the substrate 10 forming an ohmic junction with the substrate 10.

With the manufacturing method described above, no high-temperature thermal processing steps are performed after formation of the mesa 19, and therefore the mesa 19 formation does not affect the fine processing of the device. If the low concentration layer 12 is formed of SiC or GaN, the thickness of the low concentration layer 12 can be made 10% the thickness occurring for a silicon substrate, and therefore the mesa 19 can be formed easily.

Figure 15:
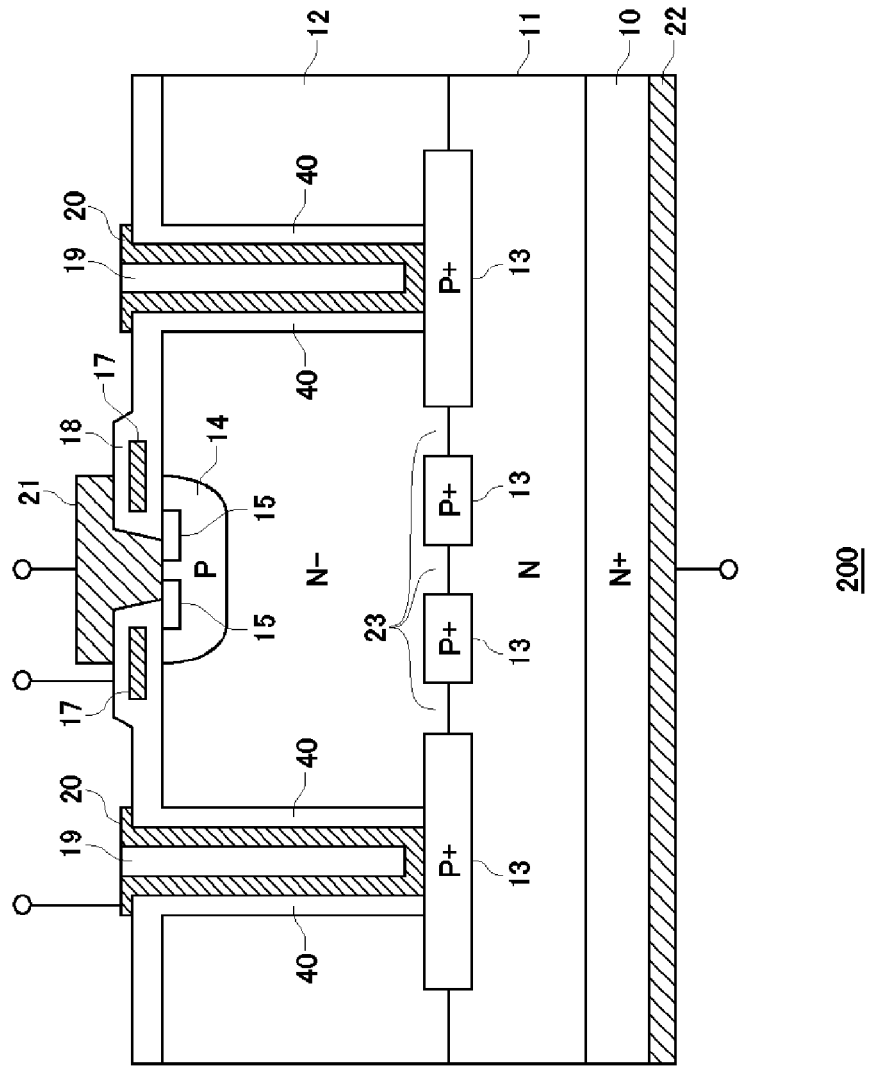
FIG. 15 is a cross-sectional view of a bidirectional device according to a second embodiment of the present invention.

FIG. 15 is a cross-sectional view of a bidirectional device 200 according to a second embodiment of the present invention. Components that have the same function as those in the first embodiment are given the same reference numerals, and descriptions thereof are omitted. The bidirectional device 200 differs from the bidirectional device 100 in that an insulating film 40 is formed between the low concentration layer 12 and the second control electrode 20. The insulating film 40 may be formed on the inner wall of the mesa 19. The second control electrode 20 forms an ohmic junction with the first semiconductor region 13 on the bottom surface.

In the bidirectional device 200, a Schottky junction is not formed between the second control electrode 20 and the low concentration layer 12. During the step of forming the mesa 19, it is sometimes difficult to arrange the crystallinity of the inner wall of the mesa 19, due to reasons such as the semiconductor side surface being rough. In such a case, it is difficult to form an ideal Schottky junction, and the leak current increases. The bidirectional device 200 of the present embodiment does not experience the problem of leak current caused by the Schottky junction. Furthermore, by interposing the insulating film 40 between the second control electrode 20 and the low concentration layer 12, the breakdown voltage can be maintained.

Next, the manufacturing method for the bidirectional device 200 is described. The bidirectional device 200 manufacturing method differs from the bidirectional device 100 manufacturing method of the bidirectional device 100 by including a step of forming an insulating film between the mesa formation step and the electrode formation step. The insulating film formation step includes using the mask 33, which was used in the mesa formation step, to form an insulating film 40 over the entire inner surface of the mesa 19 through plasma CVD. The insulating film 40 may be a silicon oxide film. Next, using dry etching, only the insulating film 40 formed on the bottom surface within the mesa 19 is removed. Next, at the electrode formation step, the second control electrode 20 is deposited on the bottom surface of the mesa 19 to form an ohmic junction with the first semiconductor region 13, through sputtering.

Figure 16:
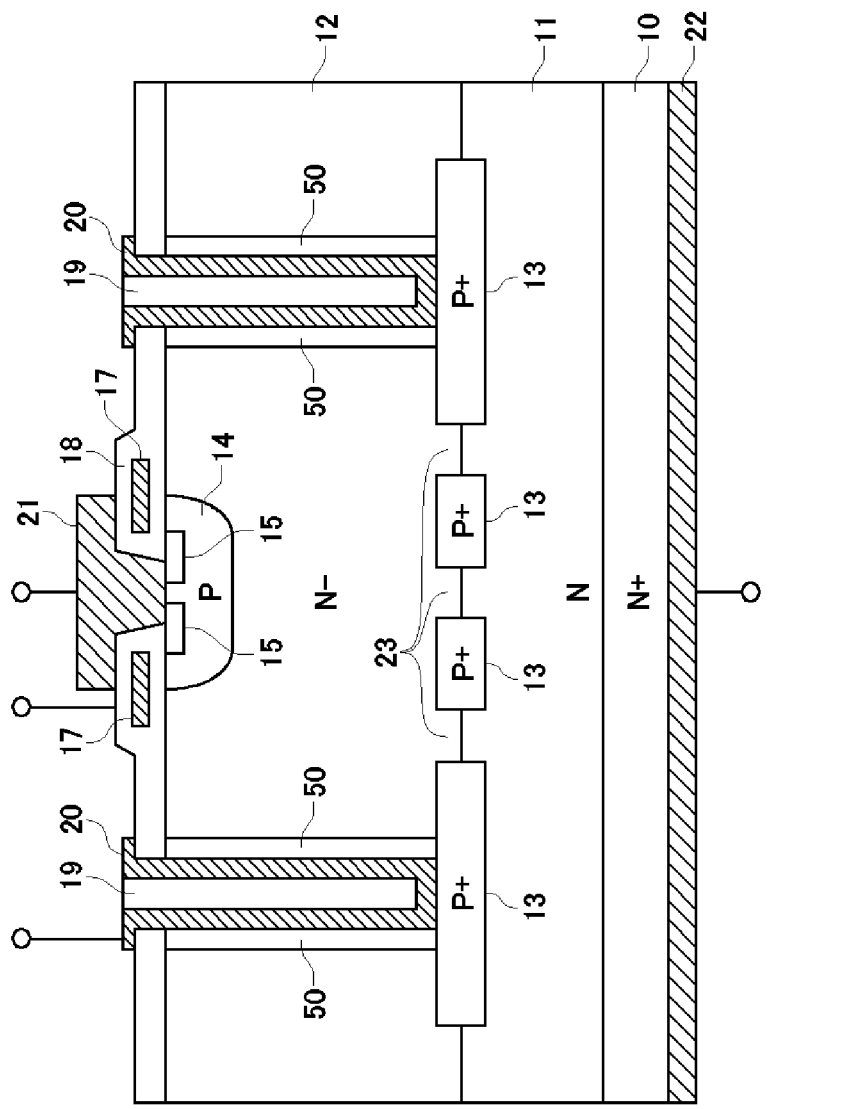
FIG. 16 is a cross-sectional view of a bidirectional device according to a third embodiment of the present invention.

FIG. 16 is a cross-sectional view of a bidirectional device 300 according to a third embodiment of the present invention. Components that have the same function as components in the bidirectional device 100 or bidirectional device 200 are given the same reference numerals, and description thereof is omitted. The bidirectional device 300 differs from the bidirectional device 200 in that, instead of the insulating film 40, a P+ type semiconductor region 50 (fifth semiconductor region) is formed between the low concentration layer 12 and the second control electrode 20.

The P+ type semiconductor region 50 and the low concentration layer 12 form a PN junction. To form a junction with low leakage at the Schottky junction, it is preferable to form an ideal interface with good crystallinity through cleaning between the semiconductor surface and the metal interface. However, a technique with high precision is necessary to form such an interface. Furthermore, leak current occurs easily when the Schottky junction functions at high temperatures. Therefore, in the present embodiment, the leak current is decreased by forming the PN junction on the side surface of the mesa 19. Furthermore, when the reverse bias is applied to the first semiconductor region 13, the breakdown voltage is maintained due to the depletion layer of the PN junction.

Figure 17:
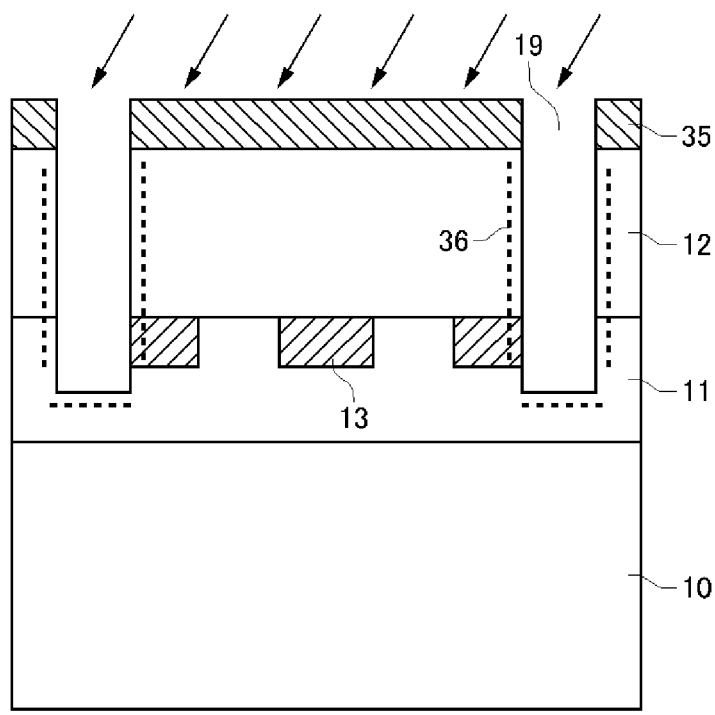
FIG. 17 shows a step in the manufacturing method of the bidirectional device shown in FIG. 16.
Figure 18:
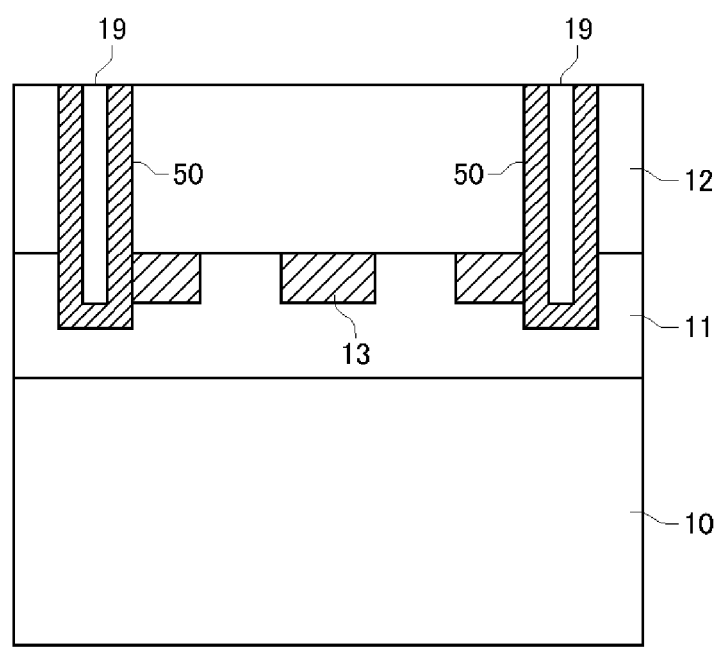
FIG. 18 shows a step following the step shown in FIG. 17.

Next, the bidirectional device 300 manufacturing method is described. The bidirectional device 300 manufacturing method differs from the bidirectional device 100 manufacturing method in that the mesa formation step is performed before the device formation step, and a step of forming the P+ type semiconductor region 50 is included after the mesa formation step. FIGS. 17 and 18 show steps of forming the P+ type semiconductor region 50. The P+ type semiconductor region formation step includes a step of ion-implanting P type impurity ions with a high concentration in the mesa 19 and an annealing step of activating the impurity ions through thermal processing.

FIG. 17 shows a step of ion implantation in the mesa 19. Using the mask 35 that was used in the mesa formation step, the P type impurity ions are implanted in the inner side surface of the mesa 19. The region near the surface on the inner side of the mesa 19 is doped with a high concentration of the P type impurity ions 36. In FIG. 17, the mesa 19 is shown as passing through the first semiconductor region 13. However, as shown in FIG. 16, the mesa 19 need not pass through the first semiconductor region 13. In other words, the bottom surface of the mesa 19 may match the top surface of the first semiconductor region 13, which is the surface facing way from the substrate 10.

FIG. 18 shows the annealing step. After the mask 35 has been removed, thermal processing is performed at a high temperature to activate the implanted P type impurity ions. The P type impurity ions 36 are diffused in the outer surface of the mesa 19, thereby forming the P+ type semiconductor region 50. Next, the device formation step is performed to form a device with a MOSFET structure on the surface of the low concentration layer 12. Finally, the electrode formation step is performed and the second control electrode 20 is formed in the mesa 19. Instead of being formed by ion implantation, the P+ type semiconductor region 50 may be formed by forming a P type polysilicon thin film on the inner side surface of the mesa 19 or by epitaxially growing P type SiC on the inner side surface of the mesa 19.

Figure 19:
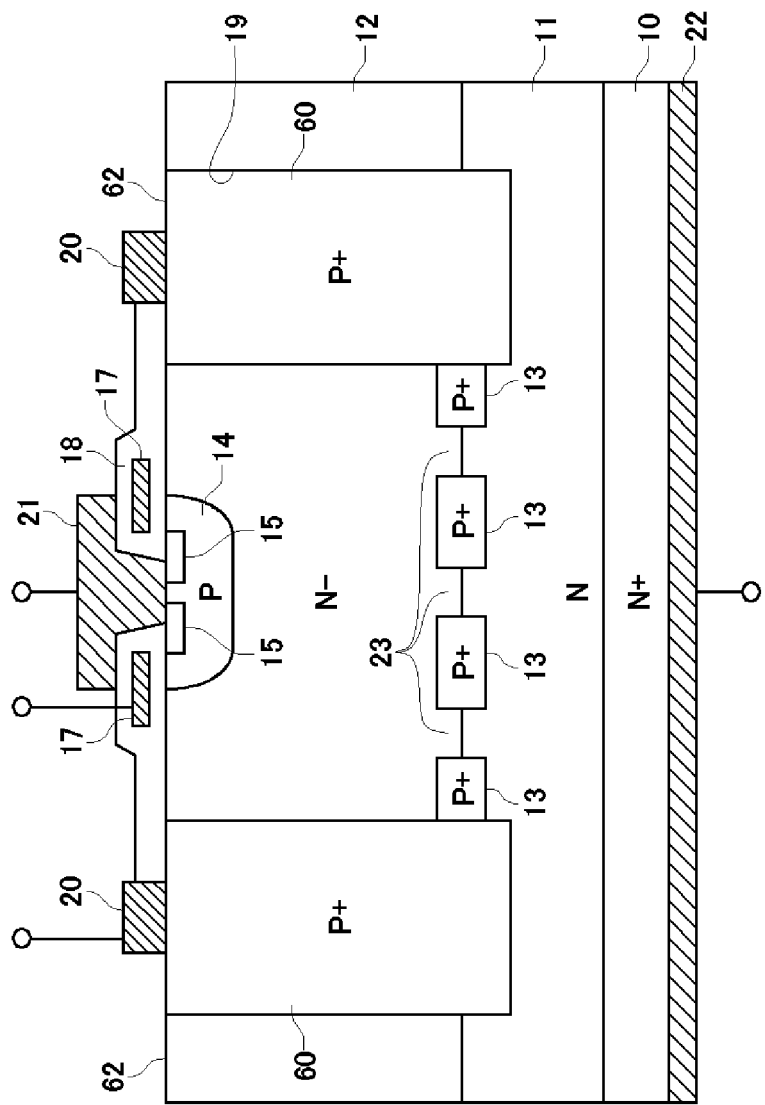
FIG. 19 is a cross-sectional view of a bidirectional device according to a fourth embodiment of the present invention.

FIG. 19 is a cross-sectional view of a bidirectional device 400 according to a fourth embodiment of the present invention. Components that have the same function as components in the bidirectional device 100, bidirectional device 200, or bidirectional device 300 are given the same reference numerals, and description thereof is omitted. The bidirectional device 400 differs from the bidirectional device 100 in that, instead of the portion of the second control electrode 20 embedded in the semiconductor layered portion 70, a P+ type semiconductor region 60 (sixth semiconductor region) is provided.

For example, by having the mesa 19 completely filled in by the P+ type semiconductor region 60, the second control electrode 20 is formed on the surface of the P+ type semiconductor region 60. The second control electrode 20 forms an ohmic junction with the P+ type semiconductor region 60. The low concentration layer 12 and the P+ type semiconductor region 60 form a PN junction. The P+ type semiconductor region 60 may be P type SiC or P type polysilicon that fills in the mesa 19.

After the mesa 19 is completely filled in, a flattening process is performed such that the surface of the P+ type semiconductor region 60 is at the same height as the surface of the low concentration layer 12. This flattening process may be realized by etching or polishing. When a deep mesa 19 is formed on the substrate 10 surface, a height difference occurs that makes it difficult to uniformly apply the photoresist. As a result, there is a limit on the fine machining, such as forming a fine pattern on the surface. In the present embodiment, the surface of the substrate 10 is flattened, and therefore fine machining is possible after this. The second control electrode 20 of the present embodiment need not be buried in the mesa 19, and therefore the second control electrode 20 can be formed easily. When the reverse bias is applied to the first semiconductor region 13, the depletion layer of the PN junction appears only on the front surface side of the device, and therefore the breakdown voltage can be maintained.

Next, the bidirectional device 400 manufacturing process is described. The bidirectional device 400 manufacturing process includes a step of preparing the substrate 10, an ion implantation step of ion-implanting P type impurities in the high concentration layer 11, an annealing step of forming the first semiconductor region 13 by thermally processing the substrate 10, a step of forming the mesa 19, a step of filling in the mesa 19 with the P+ type semiconductors, a step of flattening the surface of the substrate 10, a device formation step of forming the MOSFET device on the surface of the low concentration layer 12 surrounded by the P+ type semiconductor region 60, and an electrode formation step of forming the second control electrode 20 on the topmost surface 62 of the P+ type semiconductor region 60. The step of preparing the substrate 10, the ion implantation step, and the annealing step are the same as in the manufacturing method of the bidirectional device 100, and so the descriptions thereof are omitted. FIGS. 20 to 24 show the bidirectional device 400 manufacturing process.

Figure 20:
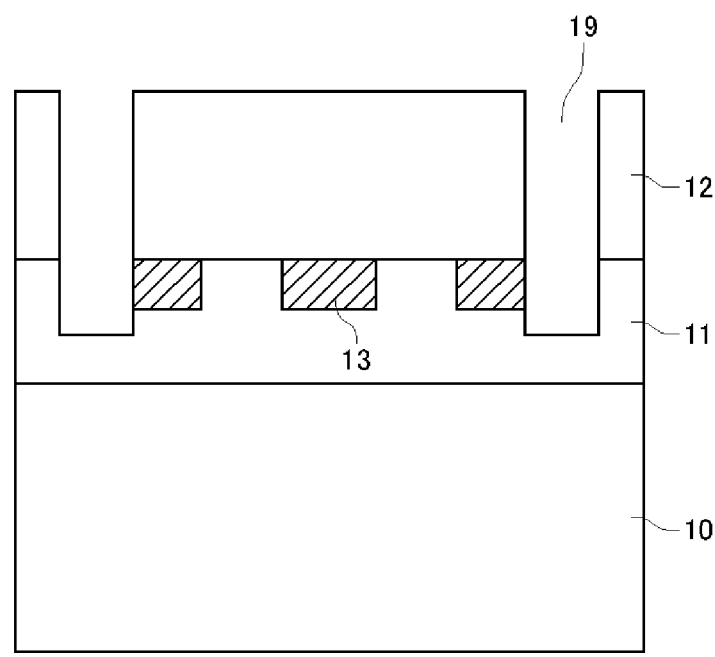
FIG. 20 shows a step in the manufacturing method of the bidirectional device shown in FIG. 19.

FIG. 20 shows the step of forming the mesa 19. Using photolithography techniques, a mask having an opening at the location where the mesa 19 is to be formed is formed on the surface of the low concentration layer 12, and dry etching is used to form the mesa 19.

Figure 21:
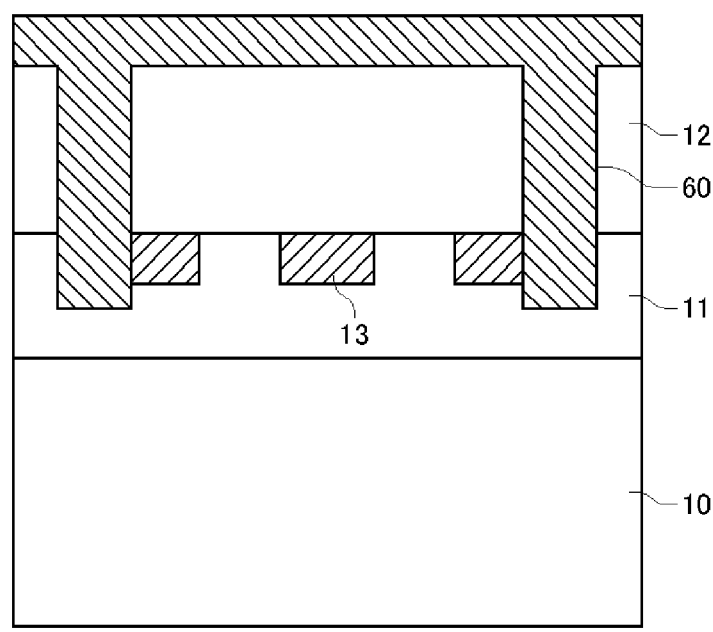
FIG. 21 shows a step following the step shown in FIG. 20.

FIG. 21 shows the step of filling in the mesa 19. P+ type polysilicon or P+ type SiC is epitaxially grown over the entire surface of the substrate 10, thereby completely filling the mesa 19. The P+ type semiconductor region 60 is formed in the mesa 19. Furthermore, P+ type polysilicon or P+ type SiC is epitaxially grown on the topmost surface of the substrate 10. The method for filling in the mesa 19 may include using an oxide film mask to perform selective epitaxial growth only in the mesa 19 portion to fill in the mesa 19, and then removing the oxide film at the end.

Figure 22:
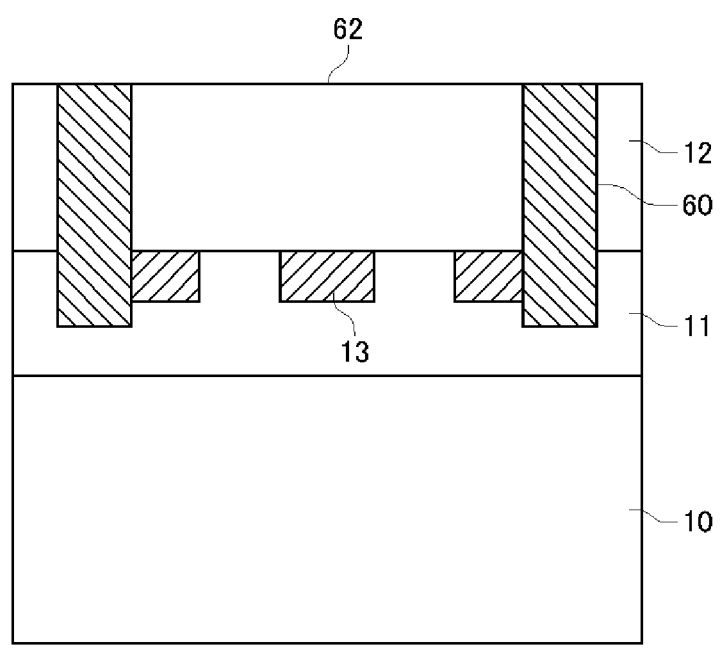
FIG. 22 shows a step following the step shown in FIG. 21.

FIG. 22 shows the flattening step. The topmost surface of the substrate 10 is flattened by etching or CMP polishing. The flattening process is performed until the topmost surface of the low concentration layer 12 and the topmost surface 62 of the P+ type semiconductor region 60 are in the same plane parallel to the substrate 10.

Figure 23:
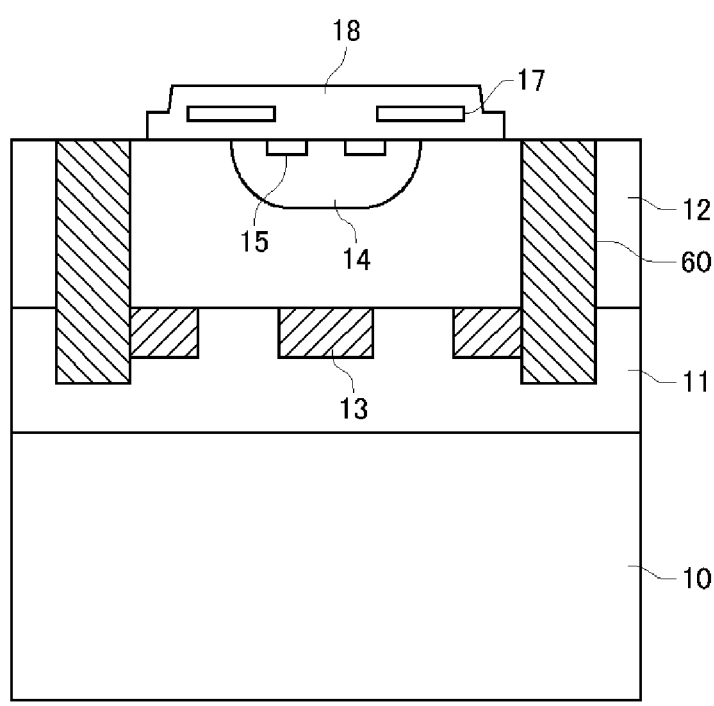
FIG. 23 shows a step following the step shown in FIG. 22.

FIG. 23 shows the device formation step. The MOSFET structure device is formed on the surface of the low concentration layer 12 surrounded by the flattened P+ type semiconductor region 60. The specific method for forming the device has been described in relation to FIG. 12, and is therefore omitted here.

Figure 24:
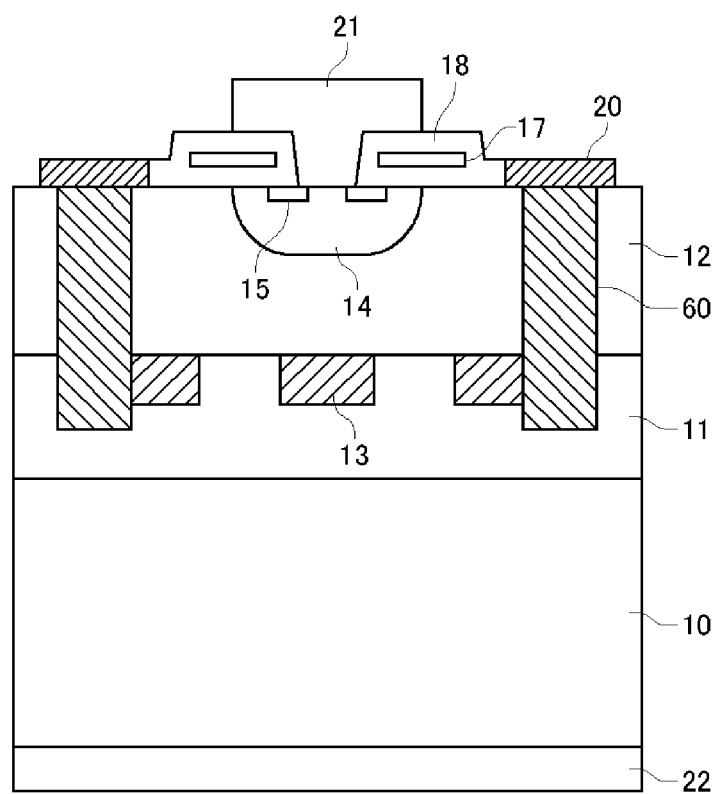
FIG. 24 shows a step following the step shown in FIG. 23.

FIG. 24 shows the electrode formation step. The second control electrode 20 is formed on the topmost surface 62 of the flattened P+ type semiconductor region 60. The second control electrode 20 and the topmost surface 62 of the P+ type semiconductor region 60 form an ohmic junction. Next, the first electrode 21 and the second electrode 22 are formed. The specific method for forming the electrodes has been described in relation to FIG. 14, and is therefore omitted here.

With the manufacturing method described above, it is possible to form a flat device on the surface of the substrate 10 without any height differences. Accordingly, a fine machining process can be realized with stability.

Figure 25:
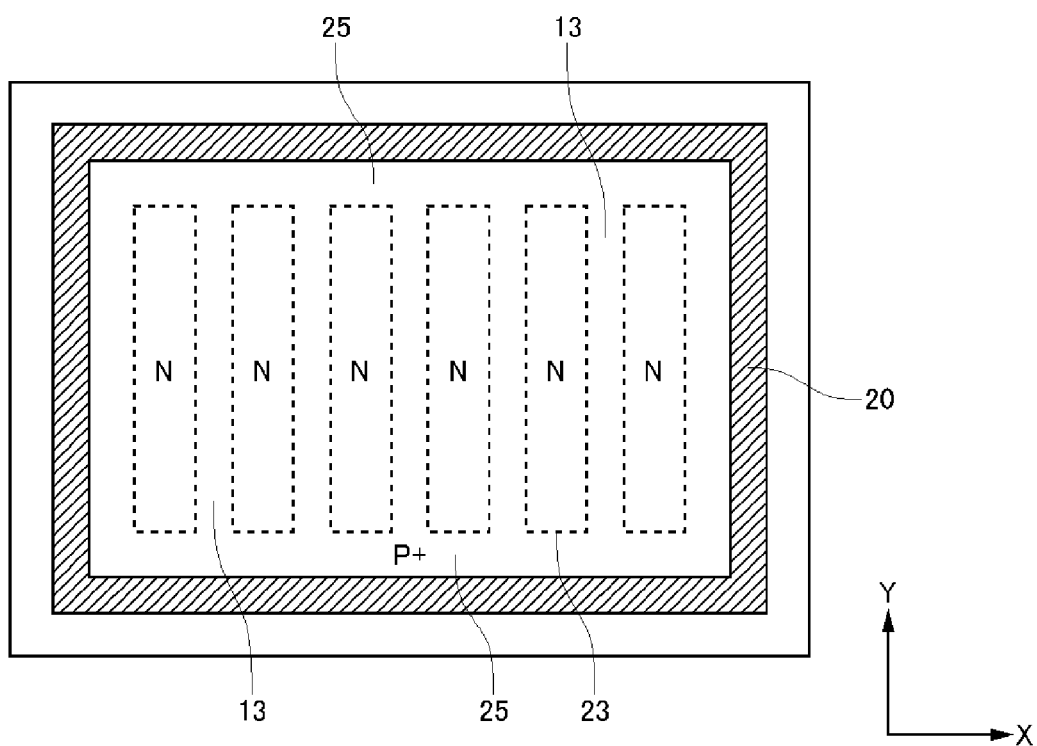
FIG. 25 is a planar view of an exemplary pattern of the P+ type gate region.

FIG. 25 is a planar view of an exemplary pattern of the first semiconductor regions 13. FIG. 25 shows a plane that is substantially parallel to the substrate 10. The second control electrode 20 has a frame shape including two edges in the X-axis direction that are parallel to each other and two edges in the Y-axis direction that are parallel to each other. In the region surrounded by the second control electrode 20, first semiconductor regions 13 that extend in the same length as each other in the Y-axis direction and are arranged at uniform intervals in the X-axis direction and P+ type connecting regions 25 that extend in the X-axis direction, are parallel to each other, and contact the ends of the first semiconductor regions 13 in the Y-axis direction are formed. The first semiconductor regions 13 are in an electrically conductive state with the second control electrode 20, via the P+ type connecting regions 25. N type second channels 23 that extend in the Y-axis direction are formed between adjacent first semiconductor regions 13. In the present embodiment, the first semiconductor regions 13 have a stripe pattern, and the depletion layer of the PN junctions with the second channels 23 spreads easily in a uniform manner. Therefore, a stable pinch-off characteristic can be realized.

Figure 26:
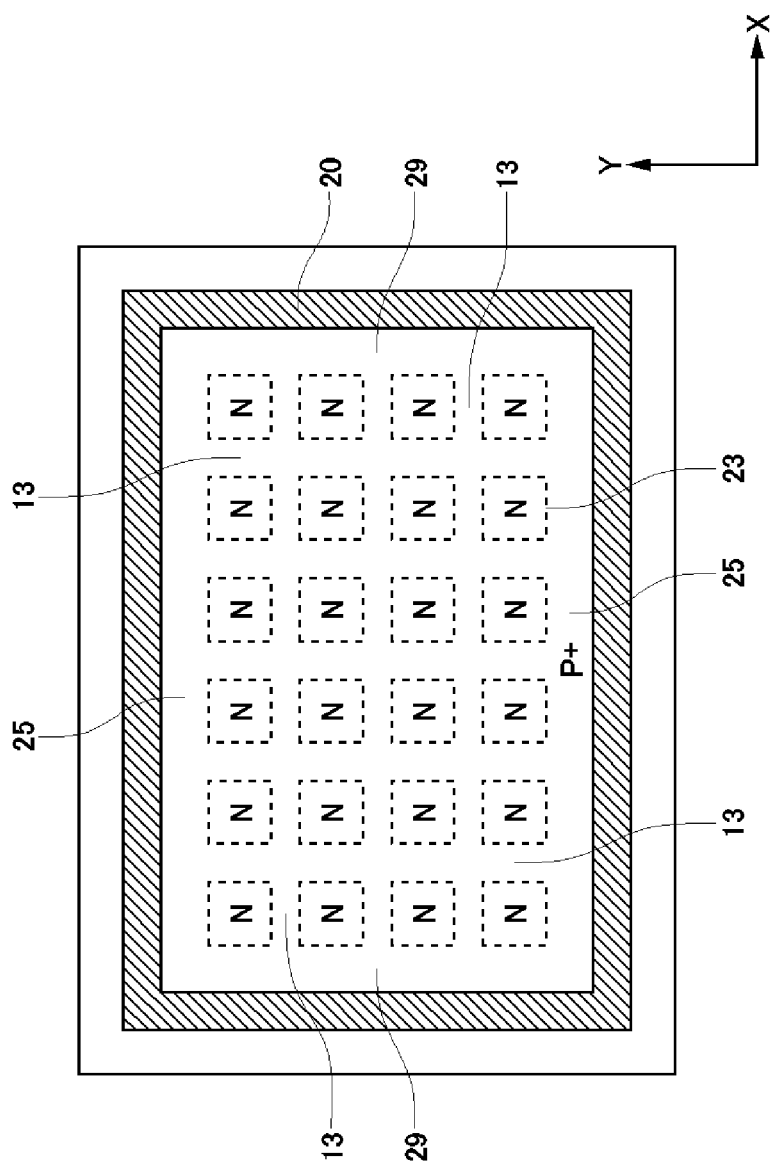
FIG. 26 is a planar view of another exemplary pattern of the P+ type gate region.

FIG. 26 is a planar view of another exemplary pattern of the first semiconductor regions 13. FIG. 26 shows a plane that is substantially parallel to the substrate 10. In the region surrounded by the second control electrode 20, first semiconductor regions 13 are arranged at uniform intervals in the X-axis direction and the Y-axis direction to form a grid along orthogonal lines, P+ type connecting regions 25 that extend in the X-axis direction, are parallel to each other, and contact the ends of the first semiconductor regions 13 in the Y-axis direction, and P+ type connecting regions 29 that extend in the Y-axis direction, are parallel to each other, and contact the ends of the first semiconductor regions 13 in the X-axis direction are formed. The first semiconductor regions 13 are in an electrically conductive state with the second control electrode 20, via the P+ type connecting regions 25 and the P+ type connecting regions 29. The N type second channels 23 are formed substantially as squares in the regions divided as boxes by the first semiconductor regions 13.

The first semiconductor regions 13 having this grid structure have less resistance than the first semiconductor regions 13 formed as stripes. Therefore, the turn-OFF characteristic of the pinch off can be improved. On the other hand, the surface area of the second channels 23 is greater when using the stripe pattern than when using the box pattern. Therefore, it is easier for the main current to flow when the stripe-shaped channels are used than when the box-shaped channels are used. The pattern of the first semiconductor regions 13 is preferably designed in consideration of the resistance of the first semiconductor regions 13 and the surface area of the second channels 23.

Figure 27:
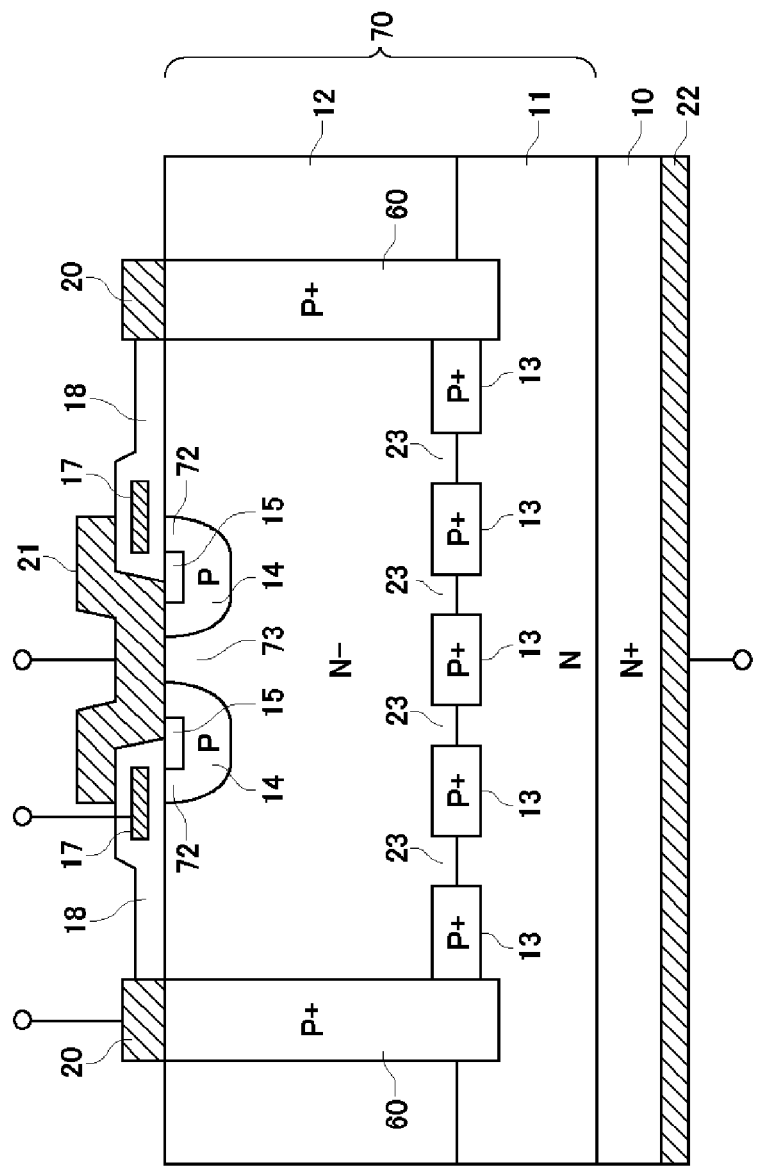
FIG. 27 is a cross-sectional view of a bidirectional device according to a fifth embodiment of the present invention.

FIG. 27 is a cross-sectional view of a bidirectional device 500 according to a fifth embodiment of the present invention. The following mainly describes the difference with respect to the first embodiment shown in FIG. 6A.

In the cross-sectional view of the bidirectional device 500, the P type diffusion region 14 of the first semiconductor element is separated into two portions. The low concentration layer 12 is provided between these two portions of the P type diffusion region 14. The low concentration layer 12 is exposed on the surface of the semiconductor layered portion 70. When the bidirectional device 500 is seen from above, the P type diffusion region 14 may be continuous in a manner to surround the low concentration layer 12.

The first electrode 21 is provided on the surface of the semiconductor layered portion 70. The first electrode 21 contacts the low concentration layer 12 on the surface of the semiconductor layered portion 70. As a result, a Schottky junction portion 73 is formed between the first electrode 21 and the low concentration layer 12, which is the second semiconductor region. The Schottky barrier diode formed by the first electrode 21 and the low concentration layer 12 has an anode and cathode that are respectively the source (e.g. the first electrode 21) and the drain (e.g. the low concentration layer 12) of the MOSFET formed on the surface of the semiconductor layered portion 70. Therefore, this Schottky barrier diode is electrically connected in parallel with the MOSFET on the surface of the semiconductor layered portion 70. The PN diode formed by the P type diffusion region 14 and the N+ type source region 15 has an anode and cathode that are respectively a source (e.g. the first electrode 21) and a drain (e.g. the low concentration layer 12). Accordingly, the PN diode is electrically connected in parallel with the Schottky barrier diode and the MOSFET.

The potential barrier of the Schottky junction occurring when the Schottky junction portion 73 is formed between the first electrode 21 and the low concentration layer 12, such as in the present embodiment, is smaller than the potential barrier of the PN junction occurring when the first electrode 21, the P type diffusion region 14, and the low concentration layer 12 are connected in series such as shown in FIG. 6A. Accordingly, by providing the Schottky junction portion 73 between the first electrode 21 and the low concentration layer 12, the power loss occurring when the MOSFET is OFF and the JFET is ON can be reduced.

In particular, when the semiconductor layered portion 70 is formed using a semiconductor material with a wide bandgap, such as SiC or GaN, the potential barrier of the Schottky junction between the metal layer, which is the first electrode 21, and the N type SiC, which is an example of the low concentration layer 12, is approximately 1 V, while the potential barrier of the PN junction between the P type SiC, which is an example of the P type diffusion region 14, and the N type SiC, which is an example of the low concentration layer 12, is an extremely large value of 3 V to 4 V. Accordingly, the effect of the power loss reduction achieved by providing the Schottky junction portion 73 between the first electrode 21 and the low concentration layer 12 is greater than this effect when the Schottky junction portion 73 is not provided.

When the MOSFET on the surface of the semiconductor layered portion 70 is OFF (e.g. a positive bias is applied to the first control electrode 17) and the JFET between the low concentration layer 12 and the high concentration layer 11 in the semiconductor layered portion 70 is ON (e.g. a zero bias is applied to the second control electrode 20), in the region where the voltage V applied to the second electrode 22 is negative, the bidirectional device 500 exhibits the I-V characteristics of a so-called diode mode.

Figure 28:
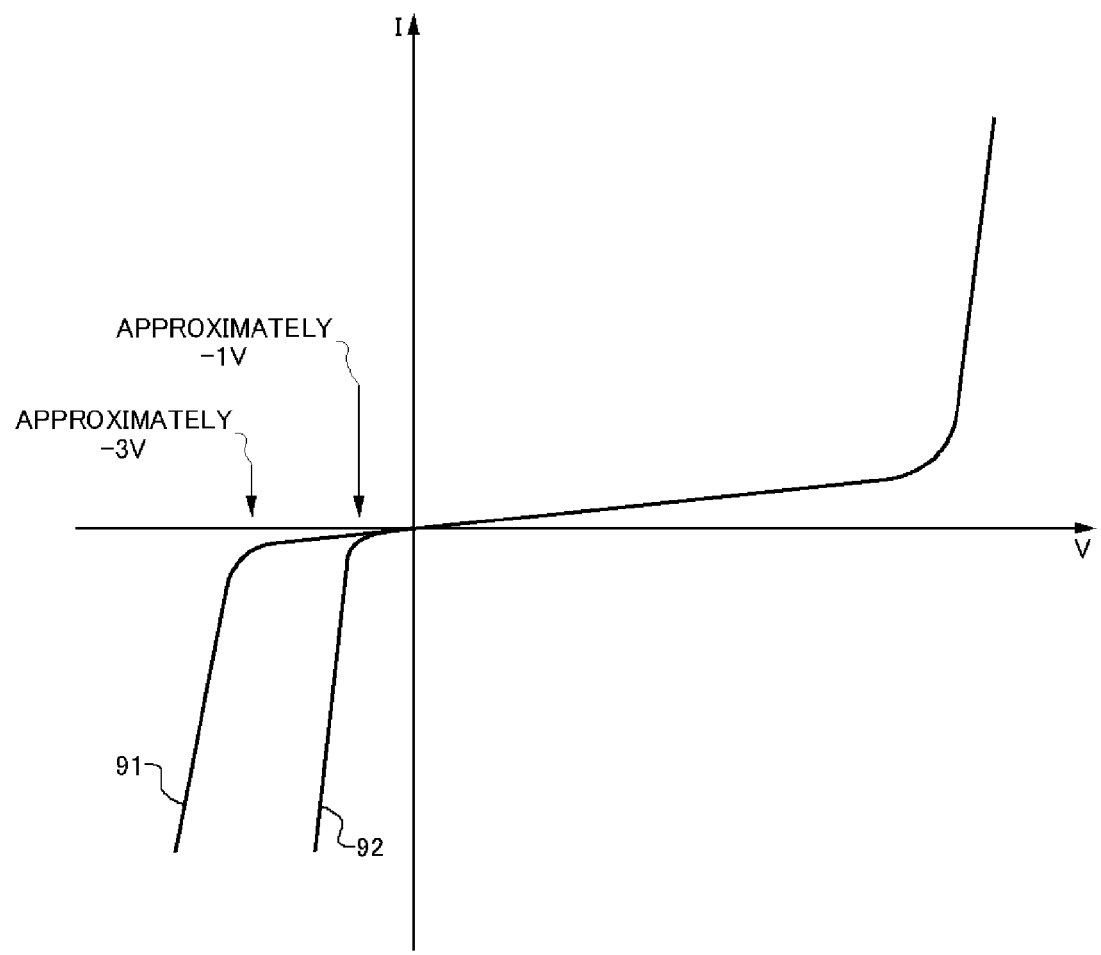
FIG. 28 is a graph showing the current-voltage characteristics of the bidirectional device shown in FIG. 27.

FIG. 28 is a graph showing the current-voltage characteristics of the bidirectional device 500 shown in FIG. 27. In a case where there is a PN junction formed by connecting the first electrode 21, the P type diffusion region 14, and the low concentration layer 12 in series, such as shown in FIG. 6A, the I-V characteristic 91 is exhibited when the MOSFET is OFF and the JFET is ON. Furthermore, in a case where the Schottky junction portion 73 is formed between the first electrode 21 and the low concentration layer 12, such as in the present embodiment, the I-V characteristic 92 is exhibited when the MOSFET is OFF and the JFET is ON. When there is no Schottky junction portion 73 and there is a potential barrier of a PN junction, as shown by the I-V characteristic 91, even when the negative bias gradually becomes high, it is difficult for current to flow until approximately −3 V, which corresponds to the potential barrier of the PN junction. In contrast to this, When there is a potential barrier of the Schottky junction in the Schottky junction portion 73, as shown by the I-V characteristic 92, when the negative bias gradually becomes high, the current begins flowing at approximately −1 V. Accordingly, in the present embodiment, the ON/OFF control of the current can be realized using a smaller negative bias than in the first embodiment, and therefore the power loss can be reduced.

Figure 29:
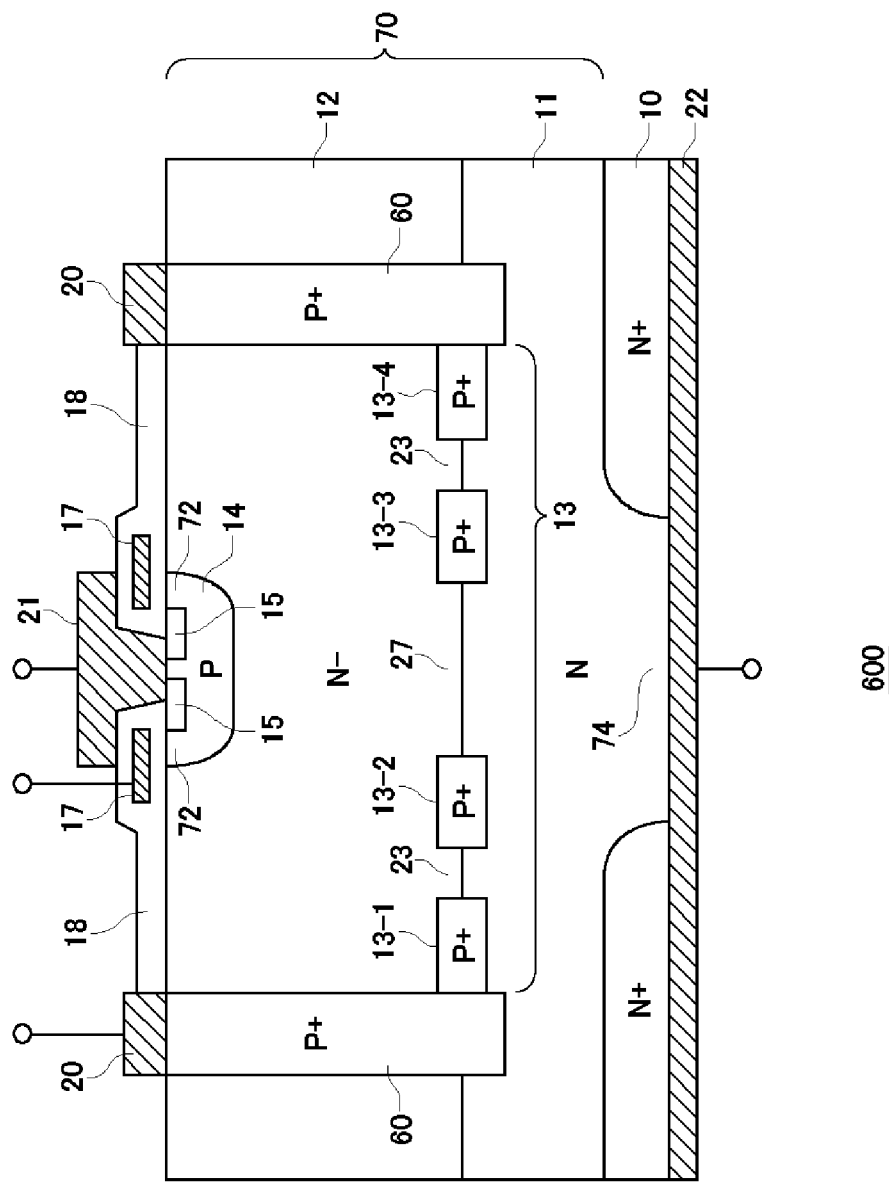
FIG. 29 is a cross-sectional view of a bidirectional device according to a sixth embodiment of the present invention.

FIG. 29 is a cross-sectional view of a bidirectional device 600 according to a sixth embodiment of the present invention. The following mainly describes the difference with respect to the first embodiment shown in FIG. 6A.

In the bidirectional device 600, the second electrode 22 is provided on the back surface of the substrate 10. Furthermore, the high concentration layer 11, which is a semiconductor layer of the first conduction type, is provided on a portion of the substrate 10. The high concentration layer 11 is formed from the back surface to the front surface of the substrate 10, and is connected to the second electrode 22 formed on the substrate 10. As a result, the Schottky junction portion 74 is formed between the high concentration layer 11 and the second electrode 22.

In the bidirectional device 600, the high concentration layer 11, which is a semiconductor layer of the first conduction type, is provided on a portion of the substrate 10. The high concentration layer 11 may be formed by removing the substrate 10. Instead, if the substrate 10 is an N+ layer, for example, the high concentration layer 11 may be provided by counter-doping with a P type dopant.

In the bidirectional device 600, the first semiconductor region 13 includes a plurality of semiconductor regions 13-1, 13-2, 13-3, and 13-4 that are electrically connected to each other. The semiconductor regions 13-1, 13-2, 13-3, and 13-4 are arranged in planes substantially parallel to the substrate 10. Intervals 72 are provided between adjacent semiconductor regions among the semiconductor regions 13-1, 13-2, 13-3, and 13-4. However, it should be noted that the interval 27 between the semiconductor region 13-2 and the semiconductor region 13-3 provided between the first electrode 21 and the semiconductor layer of the first conduction type provided on a portion of the substrate 10 is larger than the interval between the semiconductor region 13-2 and the semiconductor region 13-1, which is a second channel 23, and the interval between the semiconductor region 13-4 and the semiconductor region 13-3, which is a second channel 23. In the present embodiment, the interval 27 is provided in the central portion between the two P+ type semiconductor regions 60 in the cross section. The second channels 23 are provided between the interval 27 and the P+ type semiconductor regions 60.

When the JFET formed by the high concentration layer 11, the low concentration layer 12, and the first semiconductor region 13 is OFF (e.g. when a sufficiently negative bias is applied to the second control electrode 20), the depletion layers of the JFET are formed respectively around each of the semiconductor regions 13-1, 13-2, 13-3, and 13-4. Furthermore, since there is a Schottky junction between the high concentration layer 11 and the second electrode 22, a depletion layer is formed in the high concentration layer 11 near the second electrode 22. When the JFET is OFF, the depletion layer of the semiconductor region 13-1 and the depletion layer of the semiconductor region 13-2 are connected. When the JFET is OFF and the second electrode 22 has a negative bias relative to the first electrode 21, the depletion layer of the semiconductor region 13-1 and the depletion layer of the Schottky junction are connected. Accordingly, the path of the current through the first electrode 21 from the substrate 10 via the interval 27 between the semiconductor region 13-1 and the semiconductor region 13-2 is cut off, and therefore current barely flows between the first electrode 21 and second electrode 22.

In the present embodiment, the central position of the semiconductor region 13-2 adjacent to the interval 27 is preferably on the semiconductor region 13-3 side of the boundary position between the high concentration layer 11 and the substrate 10 where the Schottky junction portion 74 is positioned. In other words, in the substrate 10 that has had a portion thereof removed, the end portions of the remaining substrate 10 are preferably on the semiconductor region 13-1 side of the central position of the semiconductor region 13-2. With this configuration, a junction is formed between the depletion layer of the first semiconductor region 13 and the depletion layer of the Schottky junction, so that the current path can be more reliably cut off. Furthermore, the central position of the semiconductor region 13-3 is preferably on the semiconductor region 13-2 side of the boundary position between the high concentration layer 11 and the substrate 10 in the Schottky junction portion 74.

When a negative bias is applied to the first electrode 21, a positive bias is applied to the second electrode 22, and the MOSFET is ON, the current flows through the first electrode 21, the first channel 72, the low concentration layer 12, the interval 27, the high concentration layer 11, the Schottky junction portion 74, and the second electrode 22, in the stated order. Furthermore, when a positive bias is applied to the first electrode 21, a negative bias is applied to the second electrode 22, the MOSFET is OFF, and the JFET is ON, the current flows through the second electrode 22, the substrate 10, the high concentration layer 11, the second channel 23 and interval 27, the low concentration layer 12, the P type diffusion region 14, and the first electrode 21, in the stated order.

The Schottky barrier diode formed by the high concentration layer 11 and the second electrode 22 has an anode and a cathode that are respectively the source (e.g. the first electrode 21) and the drain (e.g. the low concentration layer 12) of the JFET formed by the high concentration layer 11, the low concentration layer 12, and the first semiconductor region 13. As a result, the Schottky barrier diode is electrically connected in parallel with the JFET.

The potential barrier of the Schottky junction occurring when the Schottky junction portion 74 is formed between the second electrode 22 and the high concentration layer 11, such as in the present embodiment, is smaller than the potential difference between the second electrode 22 and the threshold voltage of the JFET formed from the first semiconductor region 13, the high concentration layer 11, and the low concentration layer 12 such as shown in FIG. 6A. Accordingly, by providing the Schottky junction portion 74 between the second electrode 22 and the high concentration layer 11, the power loss can be reduced.

In addition, with the present embodiment, a sufficient margin for the gate bias of the JFET can be realized. The reason for this is as follows. As an example, assume a case in which the first semiconductor regions 13 are arranged at uniform intervals between the P+ type semiconductor regions 60, such as shown in FIG. 6A. In this case, Vth represents the threshold voltage of the JFET and V20 represents the voltage of the second control electrode 20. Here, V22, which is the threshold voltage of the second electrode 22 when current begins flowing forward (i.e. from the second control electrode to the first electrode 21), is equal to Vth-V20. In this case, it is assumed that the MOSFET is ON. If it is assumed that Vth is −10 V and V20 is −15 V, then V22 is 5 V. However, a value of 5 V for V22 is too high as a threshold voltage for the device. Therefore, in order to realize a value of approximately 1 V for V22, V20 can be set to −11 V.

It should be noted that noise voltage is added to the second control electrode 20. As a result, in consideration of this noise voltage, designing the device such that the difference between the threshold voltage Vth of the JFET and the voltage V20 of the second control electrode 20 to be approximately 1 V leads to incorrect operation of the device.

Furthermore, in an actual device, there is variation in Vth for each first semiconductor region 13. When there is a variation in Vth, it is necessary to slightly adjust V20 according to each value of Vth. However, when the Schottky junction portion 74 is provided without providing the first semiconductor region 13 between the first electrode 21 and the partially removed portion of the substrate 10, such as in the present embodiment, a sufficiently negative bias can be applied to voltage V20 of the second control electrode 20 and the threshold voltage V22 can be pulled up, and therefore there is no need to slightly adjust V20 according to each different Vth. Furthermore, even when the threshold voltage V22 is pulled up, only a voltage drop of approximately 1 V occurs in the Schottky junction portion 74, and therefore the power loss can be reduced. In other words, the margin for Vth and the decrease in power loss are both achieved.

When the MOSFET on the surface of the semiconductor layered portion 70 is ON and the JFET between the low concentration layer 12 and the high concentration layer 11 in the semiconductor layered portion 70 is OFF, in the region where the voltage V applied to the second electrode 22 is positive, the bidirectional device 600 exhibits the I-V characteristics of a so-called diode mode.

Figure 30:
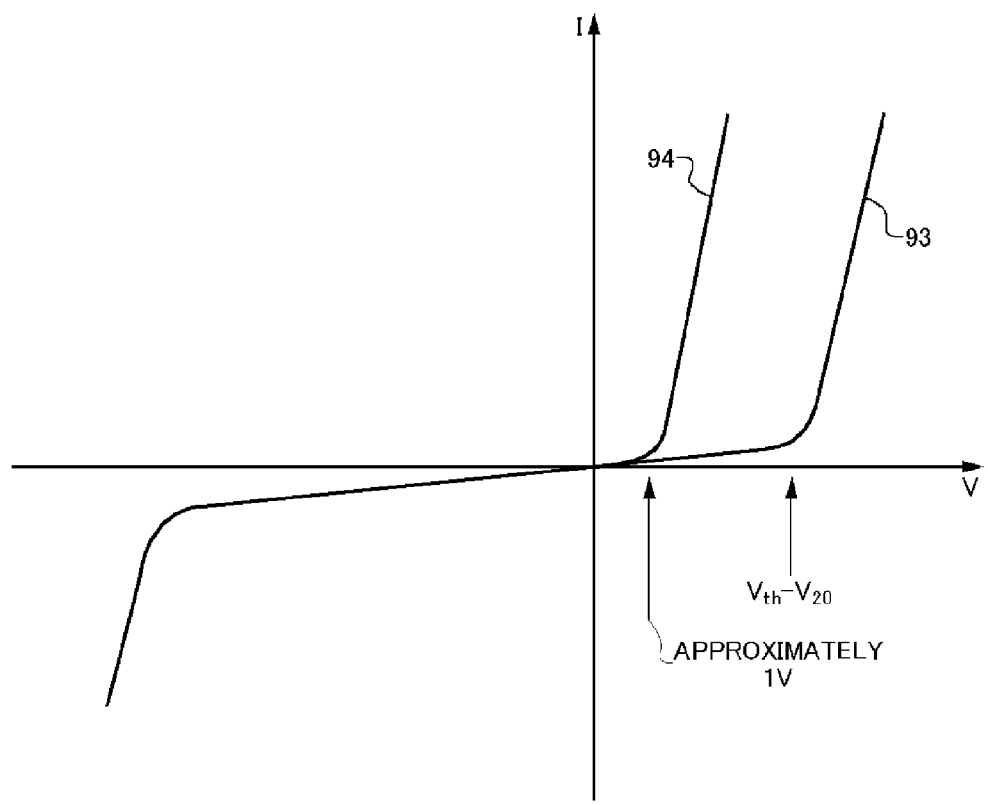
FIG. 30 is a graph showing the current-voltage characteristics of the bidirectional device shown in FIG. 29.

FIG. 30 is a graph showing the current-voltage characteristics of the bidirectional device 600 shown in FIG. 29. In a case where the first semiconductor regions 13 are arranged at uniform intervals between the P+ type semiconductor regions 60, such as shown in FIG. 6A, the I-V characteristic 93 is exhibited when the MOSFET is ON and the JFET is OFF. In a case where the Schottky junction portion 74 is formed between the second electrode 22 and the high concentration layer 11 and no first semiconductor regions 13 are formed between the first electrode 21 and the substrate 10 having a portion thereof removed, such as in the present embodiment, the I-V characteristic 94 is exhibited when the MOSFET is ON and the JFET is OFF. As shown by the I-V characteristic 93, when the first semiconductor regions 13 are arranged at uniform intervals between the P+ type semiconductor regions 60, even when the positive bias gradually becomes high, the current has trouble flowing until reaching a voltage of (Vth-V20) V that corresponds to the threshold voltage of the JFET. In contrast to this, as shown by the I-V characteristic 94, in a case where the Schottky junction potential barrier is present, when the negative bias gradually becomes higher, the current begins flowing at a voltage of approximately 1 V. In other words, in the present embodiment, the ON/OFF control of the current can be realized using a smaller positive bias than in the first embodiment, and therefore the power loss can be reduced.

Figure 31:
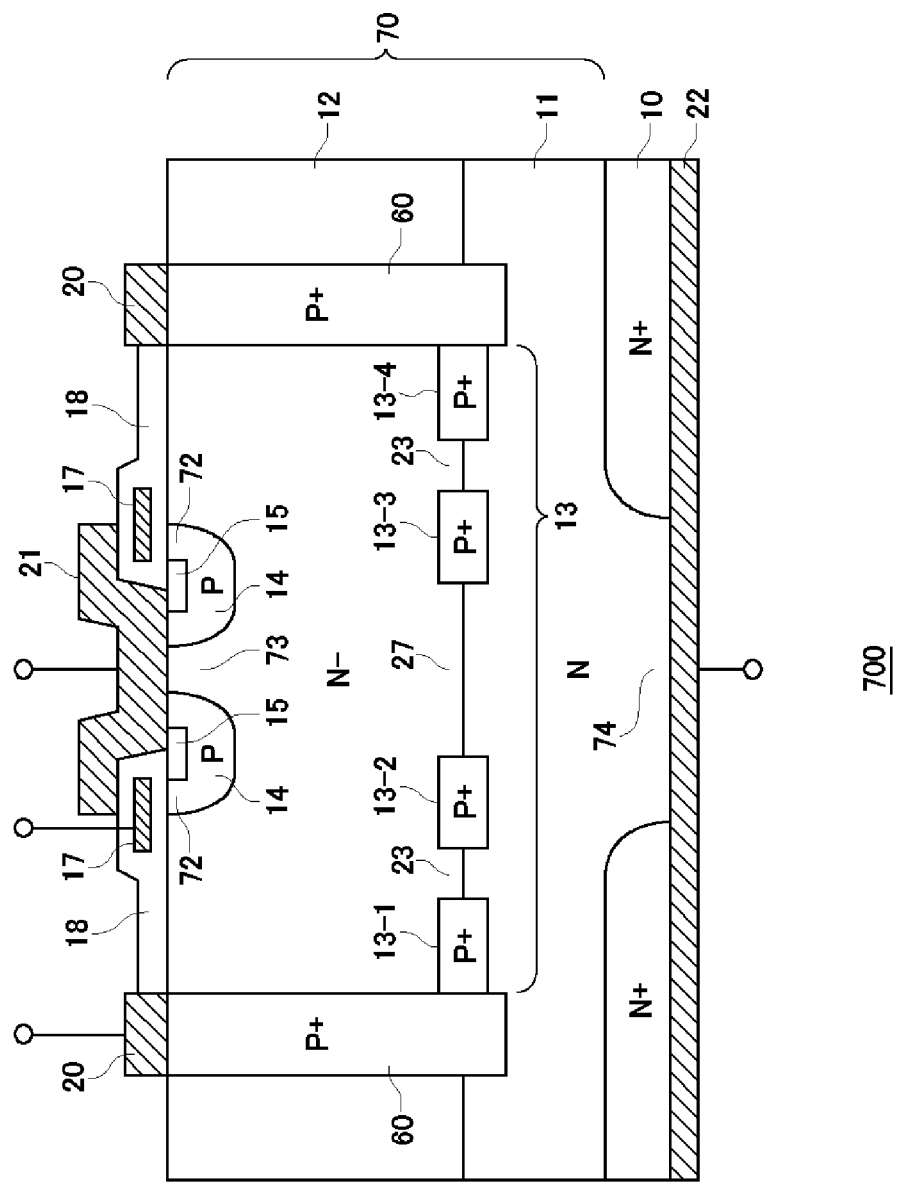
FIG. 31 is a cross-sectional view of a bidirectional device according to a seventh embodiment of the present invention.

FIG. 31 is a cross-sectional view of a bidirectional device 700 according to a seventh embodiment of the present invention. The bidirectional device 700 of the present embodiment includes both the Schottky junction portion 73 of the first electrode 21 and the low concentration layer 12 described in the fifth embodiment and the interval 27 and Schottky junction portion 74 of the second electrode 22 and the high concentration layer 11 described in the sixth embodiment. With this configuration, the diode mode on the negative bias side described in the fifth embodiment and the diode mode on the positive bias side described in the sixth embodiment can both be realized by a single device. The Schottky junction may be formed at least at one position including a position between the first electrode 21 and the low concentration layer 12, which is a second semiconductor region, and a position between the second electrode 22 and the high concentration layer 11, which is a semiconductor layer of the first conduction type provided in the region where the portion of the substrate 10 has been removed. With this configuration, the diode mode on the negative bias side described in the fifth embodiment or the diode mode on the positive bias side described in the sixth embodiment can be realized.

Figure 32:
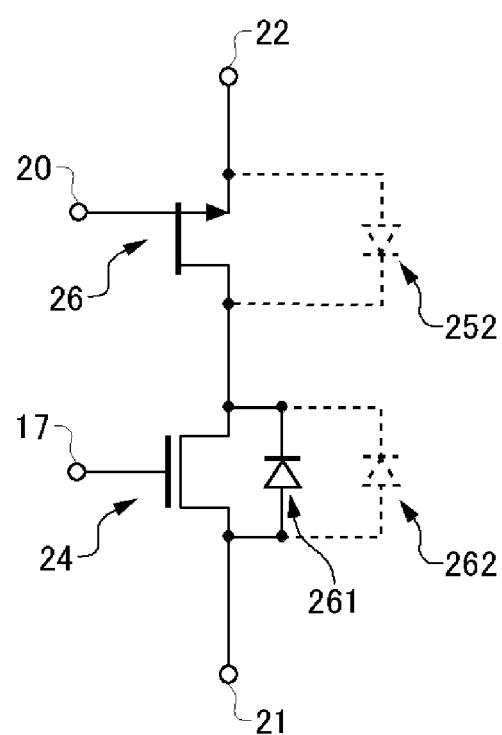
FIG. 32 is an analogous circuit of the bidirectional device shown in FIG. 31.

FIG. 32 shows an analogous circuit of the bidirectional device 700 shown in FIG. 31. The JFET 26 and the Schottky barrier diode 252 are electrically connected in parallel. The MOSFET 24, the PN diode 261, and the Schottky barrier diode 262 are electrically connected in parallel. Only one of the Schottky barrier diode 252 and the Schottky barrier diode 262 shown by the dotted lines need be included.

As described above, the JFET 26 and the Schottky barrier diode 252 are electrically connected in parallel. Furthermore, as described above, the MOSFET 24, the PN diode 261, and the Schottky barrier diode 262 are electrically connected in parallel. In addition, the JFET 26 and the MOSFET 24 are electrically connected in series by the low concentration layer 12. Accordingly, the JFET 26 and the Schottky barrier diode 252 are electrically connected in series with the MOSFET 24, the PN diode 261, and the Schottky barrier diode 262.

The bidirectional device described above can be used as a bidirectional device circuit when combined with a control circuit. This control circuit controls the voltage applied to the first control electrode 17 and the second control electrode 20, in the manner described in relation to FIGS. 1 to 26. This bidirectional device circuit can be used in a power conversion apparatus that converts AC current directly to a desired DC current, for example. The power conversion apparatus includes an input-side circuit for receiving AC power, an output-side circuit for outputting AC power, and a bidirectional device that is arranged between the input-side circuit and the output-side circuit. The input-side circuit has at least an input terminal that receives AC power, and the output-side circuit has at least an output terminal that outputs AC power. For example, any one of the bidirectional devices described in relation to FIGS. 1 to 26 may be used as the bidirectional switch 220 of a power conversion apparatus 2000. The power conversion apparatus can be used in any of a variety of industrial fields, including the automobile field.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A longitudinal bidirectional device in which current flows in a layering direction of a semiconductor layered portion formed on a front surface of a substrate, the bidirectional device comprising:
    a first semiconductor element that includes a first channel and is formed on the semiconductor layered portion; and
    a second semiconductor element that includes a second channel and is provided on the substrate side of the first semiconductor element within the semiconductor layered portion, wherein
    the first semiconductor element further includes a first control electrode that controls the first channel and that is formed on a surface of the semiconductor layered portion that faces away from the substrate,
    the second semiconductor element is formed on at least a portion of the surface of the semiconductor layered portion on which the first control electrode is formed and includes a second control electrode that controls the second channel,
    the first channel is formed according to a first voltage that is applied to the first control electrode, and
    the second channel is formed according to a second voltage that is applied to the second control electrode.

2. The bidirectional device according to claim 1, wherein the semiconductor layered portion includes:
    a semiconductor layer of a first conduction type that is formed on the substrate side of the first channel; and
    a first semiconductor region of a second conduction type that is formed within the semiconductor layer of the first conduction type in a plane that is substantially parallel to the substrate, such that a portion of the semiconductor layer of the first conduction type remains in the plane,
    the second control electrode is electrically connected to the first semiconductor region, and
    the second channel is formed in the semiconductor layer of the first conduction type remaining in the plane in which the first semiconductor region is formed.

3. The bidirectional device according to claim 2, wherein the first semiconductor region is separated to form a plurality of the first semiconductor regions within a plane of the semiconductor layer of the first conduction type substantially parallel to the substrate.

4. The bidirectional device according to claim 3, wherein the semiconductor layers of the first conduction type are arranged at uniform intervals in the plane in which the first semiconductor regions are formed.

5. The bidirectional device according to claim 2, wherein the semiconductor layered portion includes, in a plane that is substantially parallel to the substrate and on the first control electrode side of the first semiconductor region, a second semiconductor region of the first conduction type, a third semiconductor region of the second conduction type, and a fourth semiconductor region of the first conduction type that are adjacent to each other in the stated order, and
the first channel is formed in the third semiconductor region of the second conduction type.

6. The bidirectional device according to claim 5, wherein the semiconductor layer of the first conduction type includes:
   a high concentration layer formed on the substrate; and
   a low concentration layer that is formed on the high concentration layer and has a lower impurity concentration than the high concentration layer,
   the first semiconductor region is formed at a boundary between the high concentration layer and the low concentration layer, and
   the second semiconductor region, the third semiconductor region, and the fourth semiconductor region are formed on a front surface of the low concentration layer.

7. The bidirectional device according to claim 6, wherein the second channel is formed at a boundary portion between the high concentration layer and the low concentration layer, and is a channel in which carriers move in a direction substantially perpendicular to the substrate.

8. The bidirectional device according to claim 5, further comprising:
   a first electrode that is provided on the front surface of the semiconductor layered portion; and
   a second electrode that is provided on a back surface of the substrate, wherein
   a Schottky junction is formed at least at one of two positions including a position between the first electrode and the second semiconductor region and a position between the second electrode and the semiconductor layer of the first conduction type provided on a portion of the substrate.

9. The bidirectional device according to claim 8, wherein the first semiconductor region includes a plurality of semiconductor regions that are connected to each other, among the plurality of semiconductor regions, intervals are formed between adjacent semiconductor regions within a plane substantially parallel to the substrate, and
an interval between semiconductor regions of the plurality of semiconductor regions provided between the first electrode and the semiconductor layer of the first conduction type provided on the portion of the substrate are greater than intervals between other semiconductor regions of the plurality of semiconductor regions.

10. The bidirectional device according to claim 2, wherein the second control electrode is formed through the semiconductor layer of the first conduction type, to extend from the front surface of the semiconductor layered portion to the first semiconductor region.

11. The bidirectional device according to claim 10, wherein
the second control electrode is formed of a material that forms an ohmic junction with the first semiconductor region and forms a Schottky junction with the semiconductor layer of the first conduction type.

12. The bidirectional device according to claim 10, wherein
the second control electrode is formed of a material that forms an ohmic junction with the first semiconductor region, and
the semiconductor layered portion further includes an insulating film that is provided between the semiconductor layer of the first conduction type and the second control electrode.

13. The bidirectional device according to claim 10, wherein
the second control electrode is formed of a material that forms an ohmic junction with the first semiconductor region, and
the semiconductor layered portion further includes a fifth semiconductor region of the second conduction type that is provided between the semiconductor region of the first conduction type and the second control electrode.

14. The bidirectional device according to claim 2, wherein
the semiconductor layered portion further includes a sixth semiconductor region of the second conduction type that is formed to extend from the first semiconductor region to the front surface of the semiconductor layered portion, and
the second control electrode forms an ohmic junction with the sixth semiconductor region.

15. The bidirectional device according to claim 2, wherein the first conduction type is n type and the second conduction type is p type.

16. The bidirectional device according to claim 1, wherein the semiconductor layered portion includes a layer formed of SiC or a nitride semiconductor.

17. A bidirectional device circuit comprising:
the bidirectional device according to claim 1; and
a control circuit that controls the bidirectional device.

18. The bidirectional device circuit according to claim 17, wherein
the bidirectional device further includes:
   a first electrode formed on the front surface of the semiconductor layered portion; and
   a second electrode formed on the back surface of the substrate, and
the control circuit performs control of the first control electrode and of the second control electrode in synchronization when a voltage with a positive polarity is applied to the first electrode and a voltage with a negative polarity is applied to the second electrode.

19. The bidirectional device according to claim 17, wherein
the control circuit performs normally-OFF control for the first semiconductor element and performs normally-ON control for the second semiconductor element.

20. A power conversion apparatus that converts and outputs received AC power, comprising:
an input-side circuit that receives the AC power;
an output-side circuit that outputs the AC power; and
the bidirectional device according to claim 1 that is provided between the input-side circuit and the output-side circuit.

* * * * *